US012720930B2

(12) United States Patent
Oh et al.

(10) Patent No.: US 12,720,930 B2
(45) Date of Patent: Aug. 25, 2026

(54) DISPLAY DEVICE

(71) Applicant: LG Display Co., Ltd., Seoul (KR)

(72) Inventors: Yeonjun Oh, Gimpo-si (KR); Jungil Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 793 days.

(21) Appl. No.: 17/902,528

(22) Filed: Sep. 2, 2022

(65) Prior Publication Data

US 2023/0075846 A1 Mar. 9, 2023

(30) Foreign Application Priority Data

Sep. 3, 2021 (KR) ........................ 10-2021-0117766

(51) Int. Cl.

*H10H 20/853* (2025.01)
*H10H 20/854* (2025.01)
*H10H 20/855* (2025.01)
*H10H 20/857* (2025.01)

(52) U.S. Cl.

CPC ........ *H10H 20/853* (2025.01); *H10H 20/854* (2025.01); *H10H 20/855* (2025.01); *H10H 20/857* (2025.01)

(58) Field of Classification Search

CPC .. H10H 20/853; H10H 20/854; H10H 20/855; H10H 20/857; G06F 1/1601; H01L 25/0753; H01L 25/167

See application file for complete search history.

(56) References Cited

U.S. PATENT DOCUMENTS

2017/0154939 A1 6/2017 Song
2020/0152907 A1 5/2020 Oh et al.
2021/0167328 A1 6/2021 Kim et al.
2022/0301493 A1* 9/2022 Shin ...................... G06F 3/1446
2022/0351901 A1* 11/2022 Newlin ................... H01F 41/10
2022/0359477 A1* 11/2022 Hu ....................... H10H 20/852
2022/0406975 A1* 12/2022 Lee ....................... G06F 1/1652

(Continued)

FOREIGN PATENT DOCUMENTS

CN 106816547 A 6/2017
CN 111162100 A 5/2020

(Continued)

*Primary Examiner* — Eliseo Ramos Feliciano
*Assistant Examiner* — Thaddeus J Kolb
(74) *Attorney, Agent, or Firm* — Birch, Stewart, Kolasch & Birch, LLP

(57) ABSTRACT

According to an aspect of the present disclosure, a display device includes a substrate including a display area and a non-display area including a pad area extending from the display area and made of any one of transparent conducting oxides and oxide semiconductors. Also, the display device includes a plurality of inorganic insulating layers disposed on the substrate and a plurality of flexible films whose one ends are bonded to the pad area. The plurality of inorganic insulating layers overlaps the plurality of flexible films, and does not overlap an area between the plurality of flexible films. Therefore, according to one example of the present disclosure, a part of the plurality of inorganic insulating layers where cracks are likely to occur can be removed from the pad area. As such, it is possible to suppress the occurrence of cracks and improve reliability of the display device.

19 Claims, 17 Drawing Sheets

(56) References Cited

U.S. PATENT DOCUMENTS

| | | | | |
|---|---|---|---|---|
| 2022/0415963 | A1* | 12/2022 | Park | G09F 9/3026 |
| 2023/0014863 | A1* | 1/2023 | Kim | H10D 86/441 |
| 2024/0040727 | A1* | 2/2024 | Park | G06F 3/0412 |

FOREIGN PATENT DOCUMENTS

| | | | |
|---|---|---|---|
| CN | 112863375 | A | 5/2021 |
| JP | 2006-91583 | A | 4/2006 |
| JP | 2013-45522 | A | 3/2013 |
| KR | 10-2014-0098942 | A | 8/2014 |
| KR | 10-2017-0104190 | A | 9/2017 |
| KR | 10-2018-0079080 | A | 7/2018 |
| KR | 10-2020-0053133 | A | 5/2020 |
| KR | 10-2020-0127943 | A | 11/2020 |
| KR | 10-2021-0005447 | A | 1/2021 |
| KR | 10-2021-0066181 | A | 6/2021 |

* cited by examiner

DISPLAY DEVICE

CROSS-REFERENCE TO RELATED APPLICATIONS

This application claims priority to Korean Patent Application No. 10-2021-0117766 filed on Sep. 3, 2021, in the Republic of Korea, the entire contents of which are hereby expressly incorporated by reference into the present application.

BACKGROUND OF THE DISCLOSURE

Technical Field

The present disclosure relates to a display device, and more particularly, to a display device in which a plastic substrate is removed to improve flexibility and improve reliability of a pad area.

Discussion of the Related Art

Display devices used for a computer monitor, a TV, a mobile phone, etc. can include an organic light emitting display (OLED) that emits light by itself, a liquid crystal display (LCD) that requires a separate light source, etc.

As the display devices have been increasingly applied to diverse fields such as a computer monitor, a TV and a personal mobile device, display devices having a large display area and a reduced volume and weight have been studied.

In addition, in recent years, a display element, a line and the like can be formed on a flexible substrate made of a flexible material such as plastic. Therefore, a flexible display device can be manufactured to display an image even when being folded or rolled and thus has attracted a lot of attention as the next-generation display device.

SUMMARY OF THE DISCLOSURE

An object to be achieved by the present disclosure is to provide a display device in which one of a transparent conducting oxide layer and an oxide semiconductor layer is used as a substrate, instead of a plastic substrate.

Another object to be achieved by the present disclosure is to provide a display device in which the occurrence of cracks in a pad area is minimized.

Yet another object to be achieved by the present disclosure is to provide a display device in which warpages of a polarizing plate in a pad area are improved.

Still another object to be achieved by the present disclosure is to provide a display device in which a temporary substrate attached under a substrate can be easily separated from the substrate when the display device is manufactured.

Still another object to be achieved by the present disclosure is to provide a display device in which the permeation of moisture and oxygen is minimized.

Still another object to be achieved by the present disclosure is to provide a display device in which a plastic substrate is removed to simplify a reduce process and manufacturing costs.

Still another object to be achieved by the present disclosure is to provide a display device in which a plastic substrate is removed to minimize the generation of static electricity and improve a display quality.

Objects of the present disclosure are not limited to the above-mentioned objects, and other objects, which are not mentioned above, can be clearly understood by those skilled in the art from the following descriptions.

According to an aspect of the present disclosure, the display device includes a substrate including a display area and a non-display area including a pad area extending from the display area and made of any one of transparent conducting oxides and oxide semiconductors. Also, the display device includes a plurality of inorganic insulating layers disposed on the substrate and a plurality of flexible films whose one ends are bonded to the pad area. The plurality of inorganic insulating layers overlaps the plurality of flexible films, and does not overlap an area between the plurality of flexible films. Therefore, according to the present disclosure, a part of the plurality of inorganic insulating layers where cracks are likely to occur is removed from the pad area. Thus, it is possible to suppress the occurrence of cracks and improve reliability of the display device.

According to another aspect of the present disclosure, the display device includes a substrate including a plurality of first areas where a plurality of pad electrodes is disposed and a plurality of second areas between the plurality of first areas. Also, the display device includes a plurality of flexible films electrically connected to the plurality of pad electrodes and a first sealing member disposed on the substrate to cover the plurality of flexible films. Further, the display device includes a plurality f inorganic insulating layers disposed between the substrate and the plurality of pad electrodes in the plurality of first areas. The first sealing member covers an upper portion of the plurality of inorganic insulating layers in the plurality of first areas, and covers upper and side surfaces of the plurality of inorganic insulating layers in the plurality of second areas. Therefore, according to the present disclosure, an edge of the plurality of inorganic insulating layers is disposed inside the substrate in the plurality of second areas. Thus, it is possible to suppress the occurrence of cracks in the plurality of inorganic insulating layers caused by impacts from the outside of the display device.

Other detailed matters of the exemplary embodiments are included in the detailed description and the drawings.

According to the present disclosure, it is possible to suppress the occurrence of cracks in a display device by patterning a plurality of inorganic insulating layers in an area between a plurality of pad electrodes.

According to the present disclosure, it is possible to support a pad area by filling an adhesive member in a space between a plurality of flexible films and a plurality of inorganic insulating layers.

According to the present disclosure, it is possible to suppress caused by a substrate by patterning the substrate in an area between a plurality of pad electrodes.

According to the present disclosure, it is possible to fix and support a pad area by forming a sealing member on each of an upper portion and a lower portion of the pad area. Also, it is possible to minimize the occurrence of warpages or cracks in the pad area.

According to the present disclosure, it is possible to improve warpages of a polarizing plate by patterning a part of the polarizing plate, which can be easily warped by moisture, in an area between a plurality of pad electrodes.

According to the present disclosure, it is possible to easily fill an adhesive member in a space between a plurality of flexible films and a plurality of inorganic insulating layers by allowing the adhesive member to overflow when a display device is manufactured.

According to the present disclosure, it is possible to easily separate a substrate and a temporary substrate by cutting off an outer periphery of an adhesive member when a display device is manufactured.

According to the present disclosure, it is possible to improve flexibility of a display device by using a transparent conducting oxide layer and an oxide semiconductor layer formed into a thin film as a substrate of the display device.

According to the present disclosure, it is possible to simplify a structure of a display device and reduce manufacturing costs by using a transparent conducting oxide layer and an oxide semiconductor layer as a substrate of the display device.

According to the present disclosure, it is possible to suppress the generation of static electricity in a substrate and improve a display quality by using a transparent conducting oxide layer and an oxide semiconductor layer as the substrate of a display device.

According to the present disclosure, it is possible to manufacture a substrate of a display device by deposition in a vacuum environment. Therefore, it is possible to reduce the time used for manufacturing a substrate and minimize the formation of impurities on the substrate and the occurrence of resultant errors.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
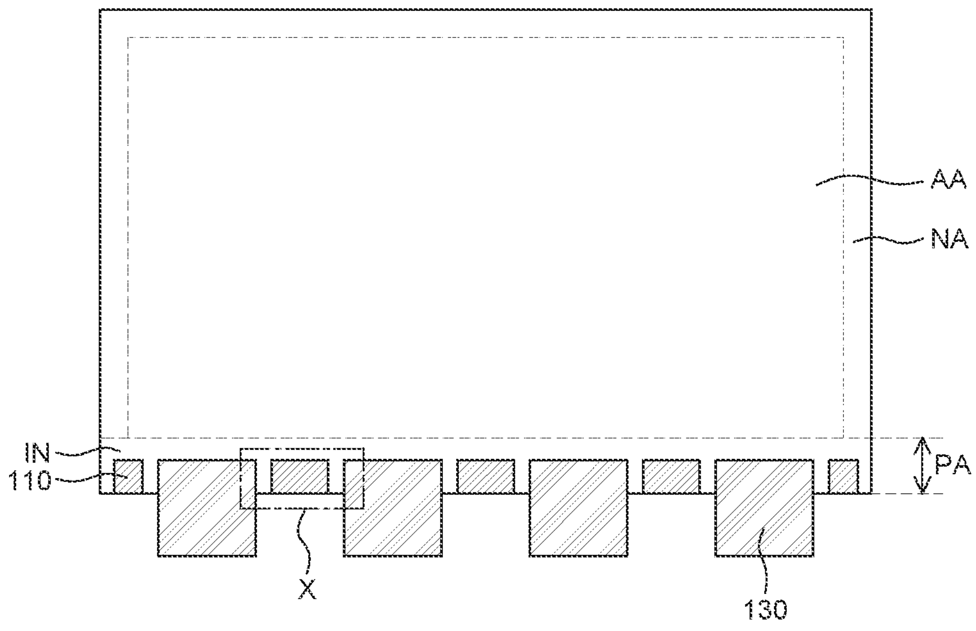
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and may not define order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

Figure 2:
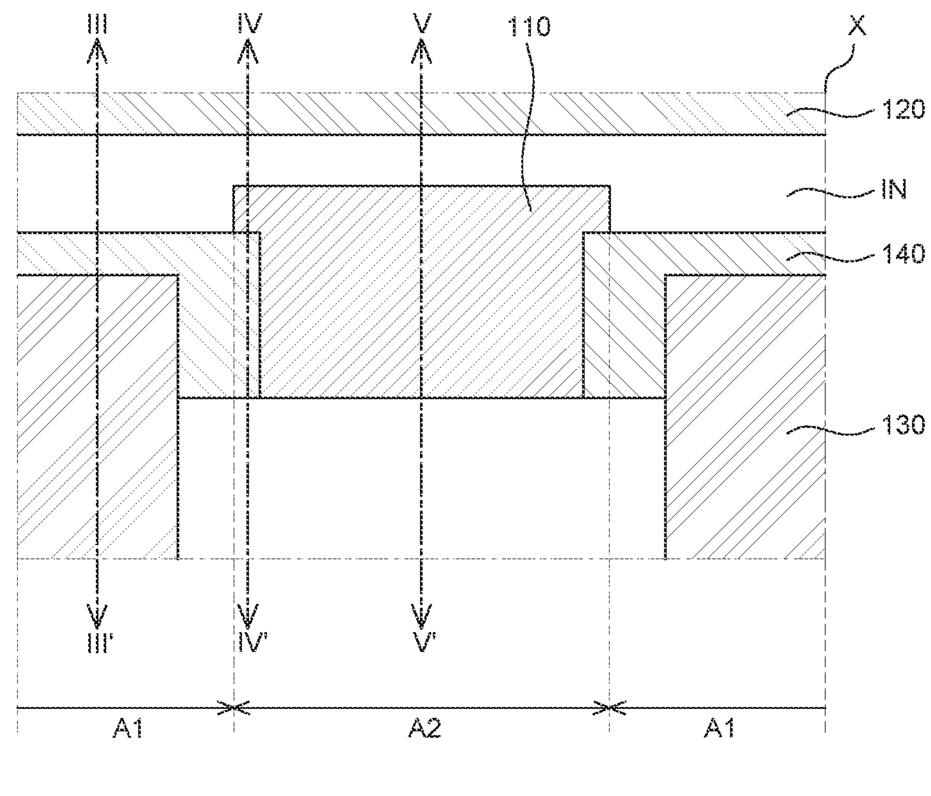
FIG. 2 is an enlarged plan view of an area X shown in FIG. 1.
Figure 3:
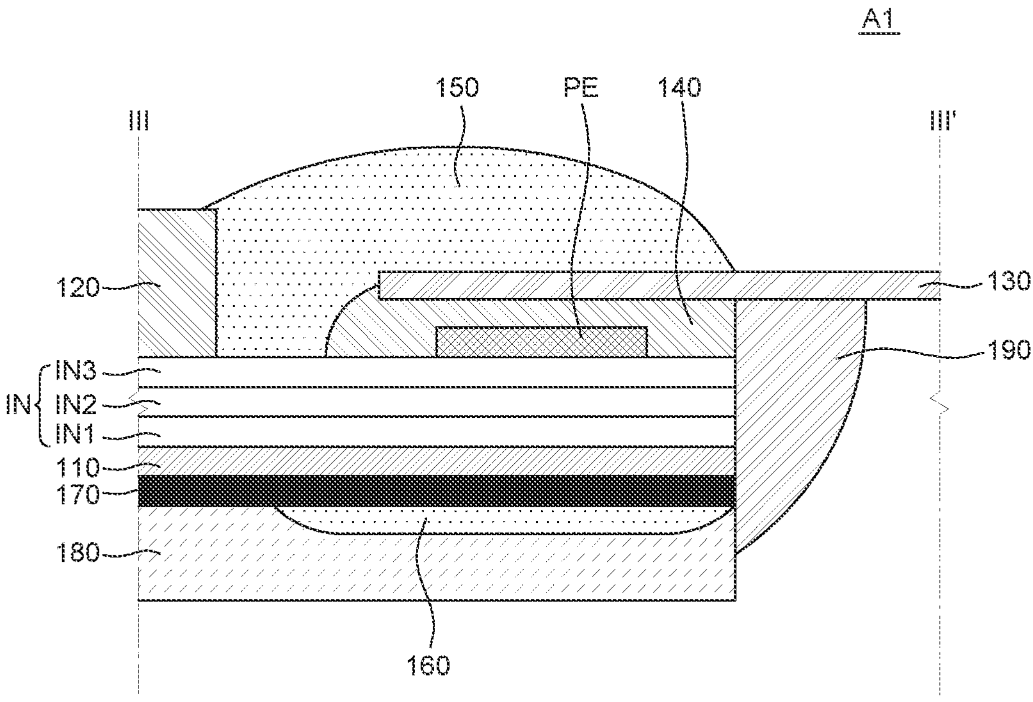
FIG. 3 is a cross-sectional view as taken along a line III-III' of FIG. 2.
Figure 4:
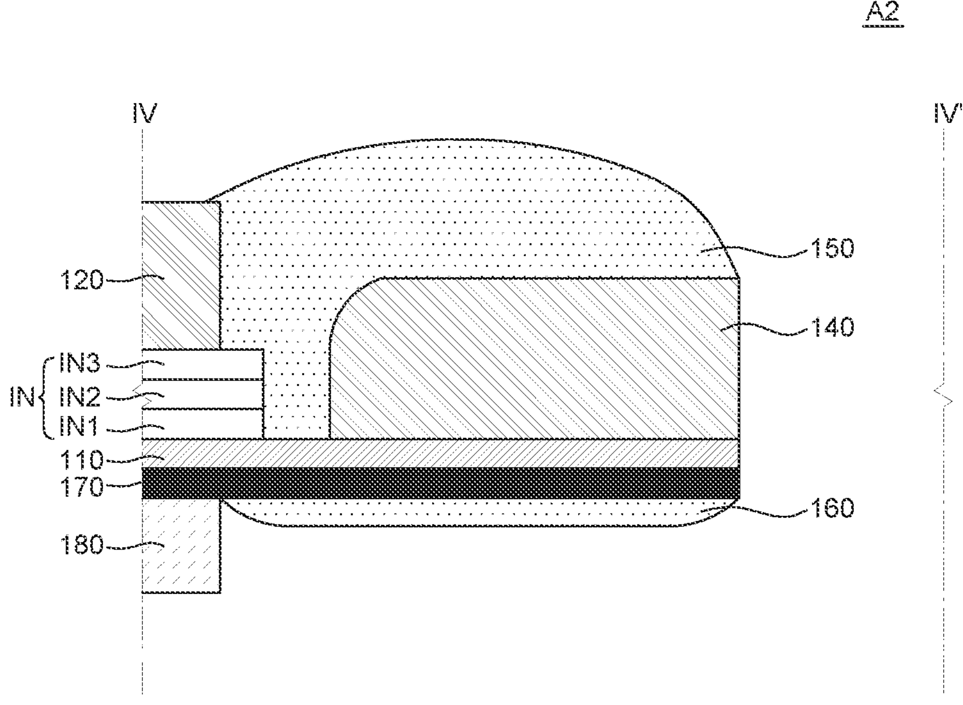
FIG. 4 is a cross-sectional view as taken along a line IV-IV' of FIG. 2.
Figure 5:
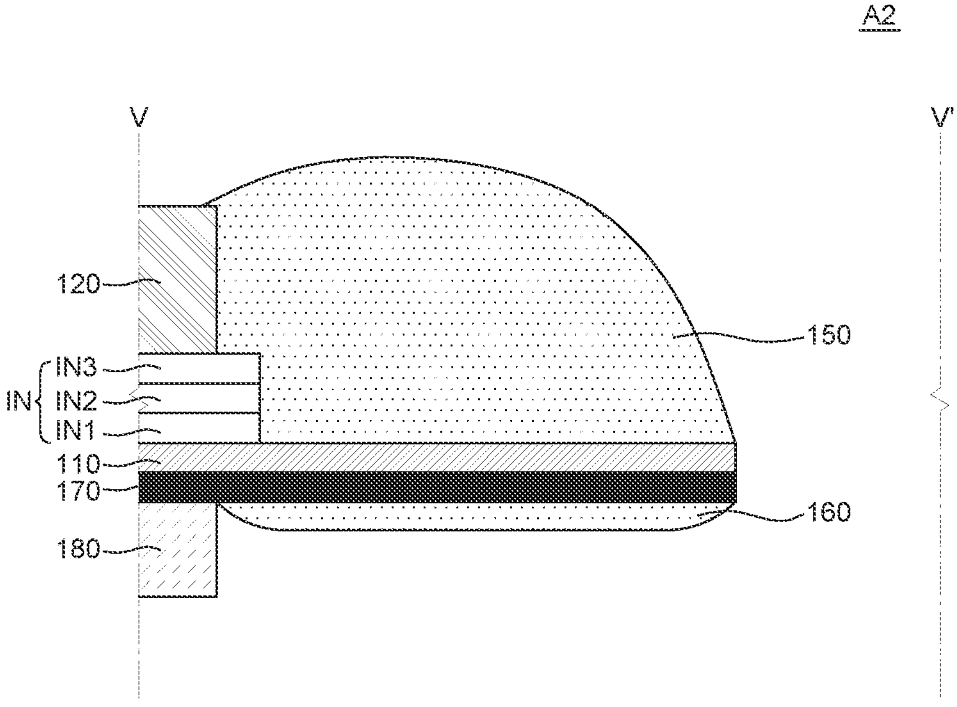
FIG. 5 is a cross-sectional view as taken along a line V-V' of FIG. 2.

FIG. 1 is a plan view of a display device according to an exemplary embodiment of the present disclosure. FIG. 2 is an enlarged plan view of an area X shown in FIG. 1. FIG. 3 is a cross-sectional view as taken along a line III-III' of FIG. 2. FIG. 4 is a cross-sectional view as taken along a line IV-IV' of FIG. 2. FIG. 5 is a cross-sectional view as taken along a line V-V' of FIG. 2.

In FIG. 1 and FIG. 2, for the convenience of description, a substrate 110, a plurality of inorganic insulating layers IN, a plurality of flexible films 130 and a plurality of adhesive members 140 among various components of a display device 100 are illustrated.

Referring to FIG. 1, the substrate 110 is a supporting member for supporting the other components of the display device 100. The substrate 110 can be made of any one of transparent conducting oxides and oxide semiconductors. For example, the substrate 110 can be made of a transparent conducting oxide (TCO) such as indium tin oxide (ITO), indium zinc oxide (IZO), indium zinc tin oxide (ITZO) and the like.

Also, the substrate 110 can be made of an oxide semiconductor material composed of indium (In) and gallium (Ga), e.g., a transparent oxide semiconductor such as indium gallium zinc oxide (IGZO), indium gallium oxide (IGO), indium tin zinc oxide (ITZO) and the like. However, the kinds of transparent conducting oxides and oxide semiconductors are not limited thereto, and the substrate 110 can be made of other transparent conducting oxides and oxide semiconductors which are not described herein.

Meanwhile, the substrate 110 can be formed by depositing a transparent conducting oxide or an oxide semiconductor to a very small thickness. Since the substrate 110 is formed to a very small thickness, it can have flexibility. Also, the display device 100 including the substrate 110 having flexibility can be implemented as a flexible display device 100 that can display an image even when being folded or rolled. For example, if the display device 100 is a foldable display device, the substrate 110 can be folded or unfolded with respect to a folding axis. For another example, if the display device 100 is a rollable display device, the display device 100 can be rolled up and stored by a roller. Therefore, the display device 100 according to an exemplary embodiment of the present disclosure can be implemented as a flexible display device 100, such as a foldable display device or a rollable display device, by using the substrate 110 having flexibility.

Also, the display device 100 according to an exemplary embodiment of the present disclosure can be to subjected to a laser lift off (LLO) process by using the substrate 110 made of a transparent conducting oxide or an oxide semiconductor. The LLO process refers to a process of separating a temporary substrate under the substrate 110 from the substrate 110 by using a laser during a manufacturing process of the display device 100. The substrate 110 is a layer for facilitating the LLO process and thus can also be referred to as a functional thin film, a functional thin film layer or a functional substrate. More details of the LLO process will be described later.

The substrate 110 includes a display area AA and a non-display area NA.

The display area AA is an area where an image is displayed. In the display area AA, a pixel unit composed of a plurality of sub-pixels can be disposed to display an image. For example, the pixel unit is composed of a plurality of sub-pixels including a light emitting element and a driving circuit to display an image.

The non-display area NA is an area where an image is not displayed and various lines and driver ICs for driving the sub-pixels disposed in the display area AA are disposed. For example, various driver ICs such as a gate driver IC and a data driver IC can be disposed in the non-display area NA. In FIG. 1, the non-display area NA is illustrated as enclosing the display area AA, but the non-display area NA can be an area extending from a part of the display area AA. However, the present disclosure is not limited thereto.

Referring to FIG. 1 through FIG. 3 together, the non-display area NA includes a pad area PA including a plurality of first areas A1 and a plurality of second areas A2. The pad area PA is a part of the non-display area NA where a plurality of pad electrodes PE is disposed and the plurality of flexible films 130 is bonded.

The plurality of first areas A1 of the pad area PA refers to an area where the plurality of pad electrodes PE is disposed. The plurality of first areas A1 refers to an area where the plurality of flexible films 130 is bonded, and can overlap the plurality of flexible films 130.

The plurality of second areas A2 of the pad area PA is located between the plurality of first areas A1. The plurality of second areas A2 is located between the plurality of pad electrodes PE and between the plurality of flexible films 130. In the plurality of second areas A2, the plurality of inorganic insulating layers IN can be patterned. Details thereof will be described later.

Meanwhile, in FIG. 1, the pad area PA is illustrated as a part of the non-display area NA corresponding to one side of the display area AA. However, the number and positions of pad areas PA can vary depending on the design, but are not limited thereto.

Referring to FIG. 1 through FIG. 3 together, the plurality of inorganic insulating layers IN is disposed on the substrate 110. The plurality of inorganic insulating layers IN is disposed between the substrate 110 and the plurality of flexible films 130. The plurality of inorganic insulating layers IN is made of an inorganic material and serves as insulating layers for protecting and insulating various components formed on the substrate 110. For example, the plurality of inorganic insulating layers IN can include a buffer layer, an interlayer insulating layer, a gate insulating layer, a passivation layer and the like. Also, the plurality of inorganic insulating layers IN can be made of silicon oxide (SiOx) or silicon nitride (SiNx), but is not limited thereto.

Referring to FIG. 3, the plurality of inorganic insulating layers IN includes a first inorganic insulating layer IN1, a second inorganic insulating layer IN2 and a third inorganic insulating layer IN3.

First of all, the first inorganic insulating layer IN1 is disposed on the substrate 110. The first inorganic insulating layer IN1 can suppress the diffusion of moisture and/or oxygen permeating from the outside of the substrate 110. It is possible to control the permeation of moisture into the display device 100 by controlling the thickness or laminated structure of the first inorganic insulating layer IN1. Also, the first inorganic insulating layer IN1 can suppress the occurrence of a short which may be caused by a contact between the substrate 110 made of a transparent conducting oxide or an oxide semiconductor and another component such as the pixel unit. The first inorganic insulating layer IN1 can be made of an inorganic material. For example, the first inorganic insulating layer IN1 can be formed as a single layer or a multilayer of silicon oxide (SiOx) or silicon nitride (SiNx), but is not limited thereto.

The second inorganic insulating layer IN2 is disposed on the first inorganic insulating layer IN1. The second inorganic insulating layer IN2 can suppress the permeation of moisture or impurities through the substrate 110. In this case, the second inorganic insulating layer IN2 can also be referred to as a buffer layer. For example, the second inorganic insulating layer IN2 can be formed as a single layer or a multilayer of silicon oxide (SiOx) or silicon nitride (SiNx), but is not limited thereto. Further, the second inorganic insulating layer IN2 can be omitted depending on the type of the substrate 110 or the configuration of the pixel unit, but is not limited thereto.

The third inorganic insulating layer IN3 is disposed on the second inorganic insulating layer IN2. The third inorganic insulating layer IN3 can be disposed to insulate a plurality of components disposed in the display area AA. For example, a plurality of transistors can be disposed on the pixel unit in the display area AA. Also, the third inorganic insulating layer IN3 can be disposed to insulate gate electrodes from active layers of the plurality of transistors or gate electrodes from source electrodes and drain electrodes. Further, the third inorganic insulating layer IN3 can be disposed to insulate a plurality of lines from various electrodes. In this case, the third inorganic insulating layer IN3 can also be referred to as a gate insulating layer, an interlayer insulating layer or a passivation layer. For example, the third inorganic insulating layer IN3 can be formed as a single layer or a multilayer of silicon oxide (SiOx) or silicon nitride (SiNx), but is not limited thereto.

Meanwhile, in the present disclosure, the plurality of inorganic insulating layers IN is described as including the first inorganic insulating layer IN1, the second inorganic insulating layer IN2 and the third inorganic insulating layer IN3. However, the plurality of inorganic insulating layers IN can further include other inorganic insulating layers in addition to the first inorganic insulating layer IN1, the second inorganic insulating layer IN2 the third inorganic and insulating layer IN3, but is not limited thereto.

Referring to FIG. 2 through FIG. 5, the substrate 110 has a rectangular shape when viewed from above, but the plurality of inorganic insulating layers IN disposed on the substrate 110 can be patterned corresponding to the plurality of second areas A2. Thus, when viewed from above, the plurality of inorganic insulating layers IN can have a different shape from the substrate 110. The plurality of inorganic insulating layers IN can overlap the plurality of flexible films 130, but does not overlap an area between the plurality of flexible films 130. That is, the plurality of inorganic insulating layers IN overlapping the plurality of second areas A2 between the plurality of flexible films 130 can be removed.

Specifically, referring to FIG. 2 and FIG. 3, the plurality of inorganic insulating layers IN can be disposed in the plurality of first areas A1 where the plurality of flexible films 130 is bonded. Therefore, in the plurality of first areas A1, an edge of the plurality of inorganic insulating layers IN can overlap an edge of the substrate 110.

Referring to FIG. 2, FIG. 4 and FIG. 5, the plurality of inorganic insulating layers IN is patterned in the plurality of second areas A2 between the plurality of flexible films 130. Thus, the plurality of inorganic insulating layers IN may not be disposed in the plurality of second areas A2. Since the plurality of inorganic insulating layers IN is not disposed in the plurality of second areas A2, an upper surface of the substrate 110 can be exposed from the plurality of inorganic insulating layers IN. In this case, an edge of the plurality of inorganic insulating layers IN is disposed inside an edge of the substrate 110 in the plurality of second areas A2. Therefore, it is possible the occurrence of cracks in the plurality of inorganic insulating layers IN caused by impacts from the outside.

Then, referring to FIG. 3, in the plurality of first areas A1 of the pad area PA, the plurality of pad electrodes PE is disposed on the plurality of inorganic insulating layers IN. The plurality of pad electrodes PE serves as electrodes electrically connected to the plurality of flexible films 130 and configured to transfer signals from the plurality of flexible films 130 to the display area AA.

The plurality of flexible films 130 is disposed on the substrate 110. One ends of the plurality of flexible films 130 are bonded onto the plurality of pad electrodes PE disposed in the pad area PA of the substrate 110. Each of the plurality of flexible films 130 is a film in which various components are disposed on a base film having malleability, and supplies a signal to the display area AA. One ends of the plurality of flexible films 130 can be disposed in the non-display area NA of the substrate 110 and can supply data voltages or the like to the display area AA. Meanwhile, although four flexible films 130 are illustrated in the drawings, the number of flexible films 130 can vary depending on the design and is not limited thereto.

Meanwhile, a driver IC such as a gate driver IC or a data driver IC can be disposed on the plurality of flexible films 130. The driver IC is a component which processes data for displaying images and a driving signal for processing the data. The driver IC can be disposed by a chip on glass (COG), chip on film (COF) or tape carrier package (TCP) technique depending on a mounting method. For the convenience of description, it is described in the present disclosure that the driver IC is mounted on the plurality of flexible films 130 by a chip on film technique, but is not limited thereto.

Referring to FIG. 2 and FIG. 3, an adhesive member 140 is disposed between the plurality of flexible films 130 and the plurality of pad electrodes PE. The plurality of flexible films 130 and the plurality of pad electrodes PE can be electrically connected through the adhesive member 140. The adhesive member 140 can be a conductive adhesive layer, for example, an anisotropic conductive film (ACF), but is not limited thereto.

Referring to FIG. 2 through FIG. 4, the adhesive member 140 can be disposed in the plurality of first areas A1 where the plurality of pad electrodes PE is disposed and at the boundary between the plurality of first areas A1 and the plurality of second areas A2. When the plurality of flexible films 130 is bonded onto the plurality of pad electrodes PE, the adhesive member 140 can overflow to the outside of the plurality of first areas A1 due to pressure. Also, the adhesive member 140 can overflow to a part of the plurality of second areas A2 adjacent to the plurality of first areas A1. Details thereof will be described later with reference to FIG. 6A through FIG. 6J.

An encapsulation unit 120 is disposed on the substrate 110 and the plurality of inorganic insulating layers IN. The encapsulation unit 120 seals the pixel unit and protects the light emitting element of the pixel unit against moisture, oxygen and impacts from the outside. The encapsulation unit 120 can be disposed to cover the display area AA of the substrate 110 and can seal the pixel unit in the display area AA.

The encapsulation unit 120 can be formed as a thin film encapsulation (TFE) by alternately laminating a plurality of inorganic layers and a plurality of organic layers. For example, the inorganic layers can be made of inorganic materials such as silicon nitride (SiNx), silicon oxide (SiOx) and aluminum oxide (AlOx), but are not limited thereto. Also, the organic layers can be made of epoxy-based or acryl-based polymers, but are not limited thereto.

Also, the encapsulation unit 120 can have a face seal structure. For example, the encapsulation unit 120 can be formed by forming a UV-curing or thermosetting sealant on the entire surface of the pixel unit.

The encapsulation unit 120 can be formed as a substrate made of a metal material. For example, the encapsulation unit 120 can be made of a material having a high modulus of elasticity in the range of from about 200 MPa to about 900 MPa. The encapsulation unit 120 can be made of a metal material, such as aluminum (Al), nickel (Ni), chromium (Cr) and an alloy of iron (Fe) and Ni, which has a high corrosion resistance and can be easily processed into foil or thin film. Since the encapsulation unit 120 is made of a metal material, it can be implemented in the form of an ultra-thin film and can provide a high resistance to external impacts and scratches.

The encapsulation unit 120 can be formed as a combination of the TFE, the face seal and the thin film substrate, or can be formed in various ways with various materials other than the above-described structures. However, the present disclosure is not limited thereto.

Referring to FIG. 3 through FIG. 5, a first sealing member 150 is disposed to enclose the display area AA. The first sealing member 150 can be disposed along the non-display area NA so as to enclose the display area AA. The first sealing member 150 can have a frame shape when viewed from above. The first sealing member 150 can be disposed to cover a side surface of the encapsulation unit 120 in the display area AA and thus can minimize the permeation of moisture and oxygen into the display area AA. Also, in the plurality of first areas A1 of the pad area PA, the first sealing member 150 can cover an upper surface of the plurality of inorganic insulating layers IN, the plurality of flexible films 130 and the plurality of adhesive members 140.

Further, in the plurality of second areas A2 of the pad area PA, the first sealing member 150 can cover upper and side surfaces of the plurality of inorganic insulating layers IN protruding to the outside of the encapsulation unit 120. Furthermore, in the plurality of second areas A2 of the pad area PA, the first sealing member 150 can cover the substrate 110 exposed from the plurality of inorganic insulating layers IN and the adhesive member 140 overflowing from the plurality of first areas A1.

The first sealing member 150 can be made of a non-conductive material having elasticity to seal a side surface of the pixel unit and supplement the stiffness of a side surface of the display device 100. Also, the first sealing member 150 can be made of an adhesive material. Further, the first sealing member 150 can further include a hygroscopic agent to absorb moisture and oxygen from the outside and minimize the permeation of moisture and oxygen through a side portion of the display device 100. For example, the first sealing member 150 can be made of polyimide (PI), polyurethane, epoxy or an acryl-based material, but is not limited thereto.

A second sealing member 160 is disposed under the substrate 110. The second sealing member 160 can be disposed on a lower surface of the substrate 110 so as to overlap at least the pad area PA of the non-display area NA of the substrate 110. The second sealing member 160 can be disposed to overlap the pad area PA and can support and fix the pad area PA. When viewed from above, the second sealing member 160 can correspond in shape to the pad area PA. The plurality of inorganic insulating layers IN is disposed in the plurality of first areas A1 of the pad area PA, but the plurality of inorganic insulating layers IN is not disposed in the plurality of second areas A2. For example, the plurality of second areas A2 can be more easily deformed by external force than the plurality of first areas A1.

Also, the substrate 110 is disposed in both the plurality of first areas A1 and the plurality of second areas A2. However, the substrate 110 is a flexible thin film layer, and, thus, it can be difficult for the substrate 110 to fix and support the plurality of first areas A1 and the plurality of second areas A2. Therefore, the second member 160 sealing is disposed corresponding to the pad area PA to support the components disposed on the pad area PA and minimize the deformation of the display device 100 in the pad area PA. For example, the second sealing member 160 can be made of polyimide (PI), polyurethane, epoxy or an acryl-based material, but is not limited thereto.

A bezel pattern 170 is disposed between the substrate 110 and the second sealing member 160. The bezel pattern 170 can be formed entirely or partly in the non-display area NA. The bezel pattern 170 can be formed in at least a part of the non-display area NA and can hide the driving circuits or lines disposed on the non-display area NA so as to be invisible to the outside. The bezel pattern 170 can be formed by coating, for example, an ink composition, but is not limited thereto.

Referring to FIG. 3, a resin layer 190 is disposed in contact with a side surface of the substrate 110, a side surface of the plurality of inorganic insulating layers IN and a lower surface of and the plurality of flexible films 130 in the plurality of first areas A1. The resin layer 190 can support a part of the flexible film 130 protruding to the outside of the pad area PA of the substrate 110. The resin layer 190 can support the flexible film 130 so as not to be excessively bent at an edge of the substrate 110. The resin layer 190 can be made of an insulating material, for example, polyimide (PI), polyurethane, epoxy or an acryl-based material, but is not limited thereto.

A polarizing plate 180 is disposed under the substrate 110, the bezel pattern 170 and the second sealing member 160. The polarizing plate 180 can selectively transmit light to reduce the reflection of external light which is incident onto the substrate 110. Specifically, in the display device 100, various metal materials applied to the semiconductor elements, lines and light emitting elements are formed on the substrate 110. Therefore, external light incident toward the substrate 110 can be reflected from the metal materials so that the visibility of the display device 100 can be reduced due to the reflection of the external light. In this case, the polarizing plate 180 that suppresses the reflection of external light is disposed under the substrate 110. Thus, it is possible to increase the outdoor visibility of the display device 100. However, the polarizing plate 180 can be omitted depending on an embodiment of the display device 100.

Referring to FIG. 3, the polarizing plate 180 is patterned in the plurality of second areas A2 of the pad area PA. Thus, the polarizing plate 180 may not be disposed in the plurality of second areas A2. A part of the polarizing plate 180 overlapping the plurality of second areas A2 can be removed, and the polarizing plate 180 can be disposed only in the plurality of first areas A1 of the pad area PA.

Specifically, the polarizing plate 180 can expand and bend due to moisture in a high humidity environment. In the plurality of first areas A1 where the plurality of inorganic insulating layers IN, the adhesive member 140 and the like are disposed and the stiffness is relatively high, the polarizing plate 180 is not likely to be deformed. However, in the plurality of second areas A2 where the plurality of inorganic insulating layers IN, the flexible film 130 and the like are not disposed and the stiffness is relatively low, the polarizing plate 180 is highly likely to be deformed. Therefore, a part of the polarizing plate 180 corresponding to the plurality of second areas A2 can be patterned so that the polarizing plate 180 is not deformed in the plurality of second areas A2 with a relatively low stiffness. In this case, the plurality of inorganic insulating layers IN is also patterned in the plurality of second areas A2. Therefore, the plurality of inorganic insulating layers IN can correspond in shape to the polarizing plate 180 when viewed from above.

Further, a barrier film as well as the polarizing plate 180 can be disposed under the substrate 110. The barrier film can protect the pixel unit including the light emitting element by minimizing the permeation of moisture and oxygen into the substrate 110 from the outside of the substrate 110. However, the barrier film can be omitted depending on an embodiment of the display device 100 and is not limited thereto.

Hereinafter, a method for manufacturing the display device 100 according to an exemplary embodiment of the present disclosure will be described with reference to FIG. 6A through FIG. 6J.

Figure 6A:
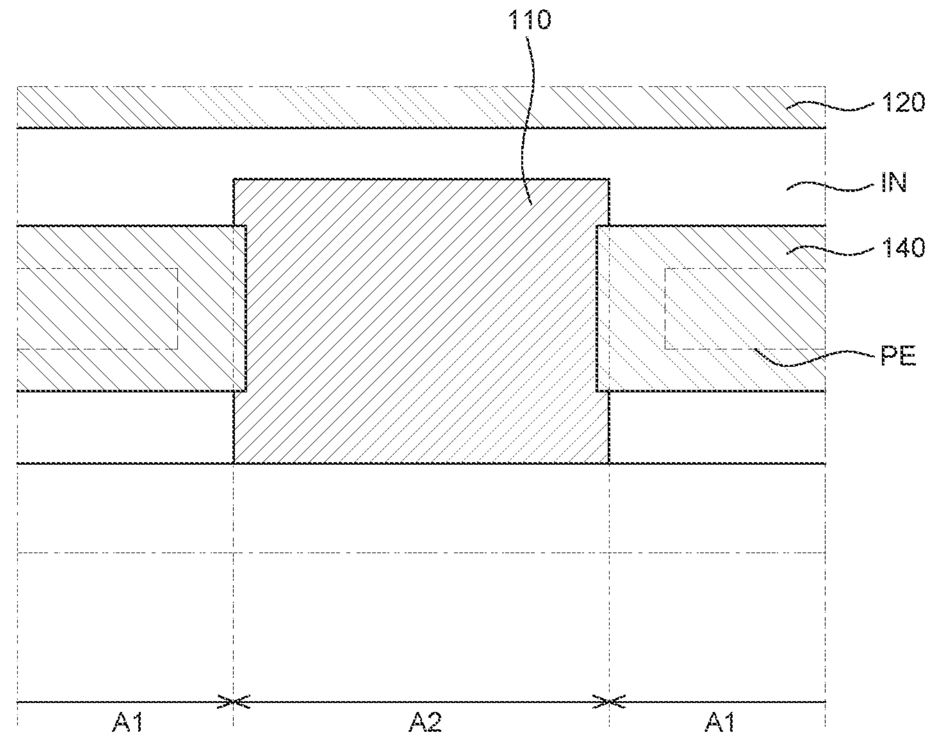
FIG. 6A through FIG. 6J are process diagrams for explaining a method for manufacturing the display device according to an exemplary embodiment of the present disclosure.
Figure 6B:
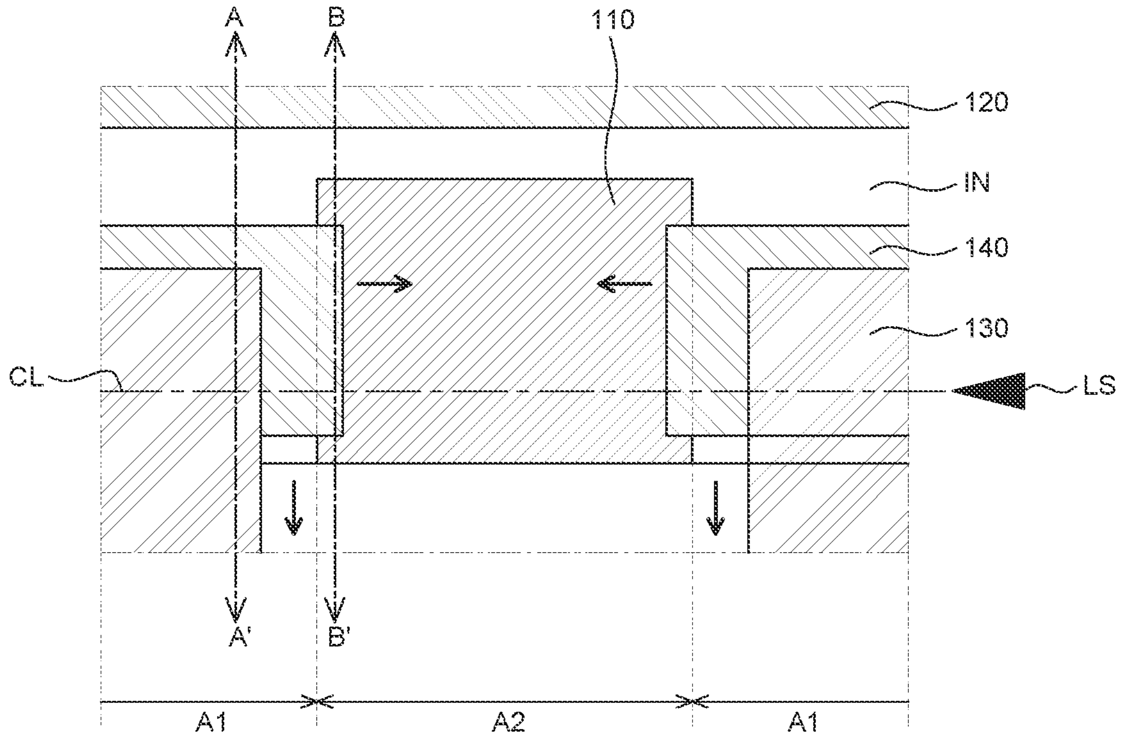
Figure 6C:
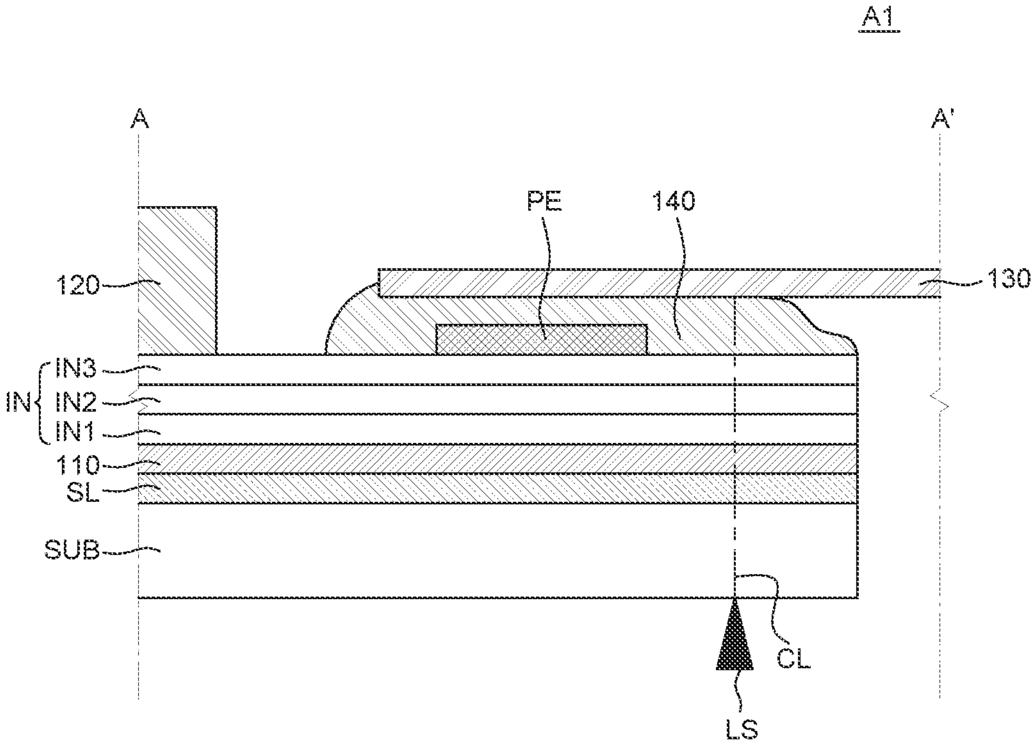
Figure 6D:
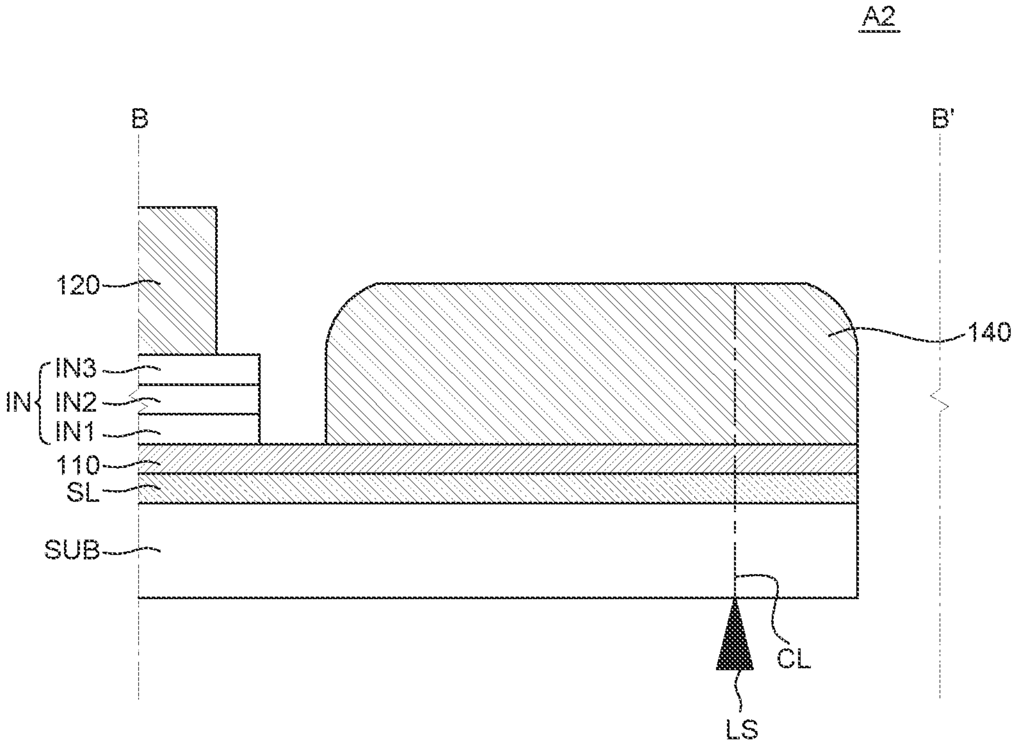
Figure 6E:
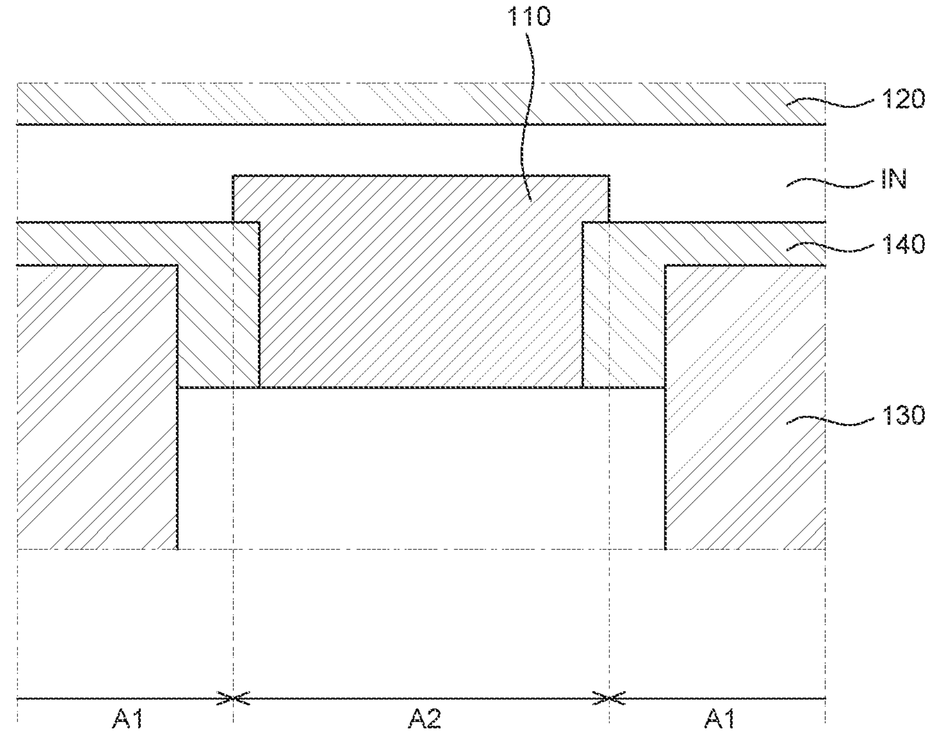
Figure 6F:
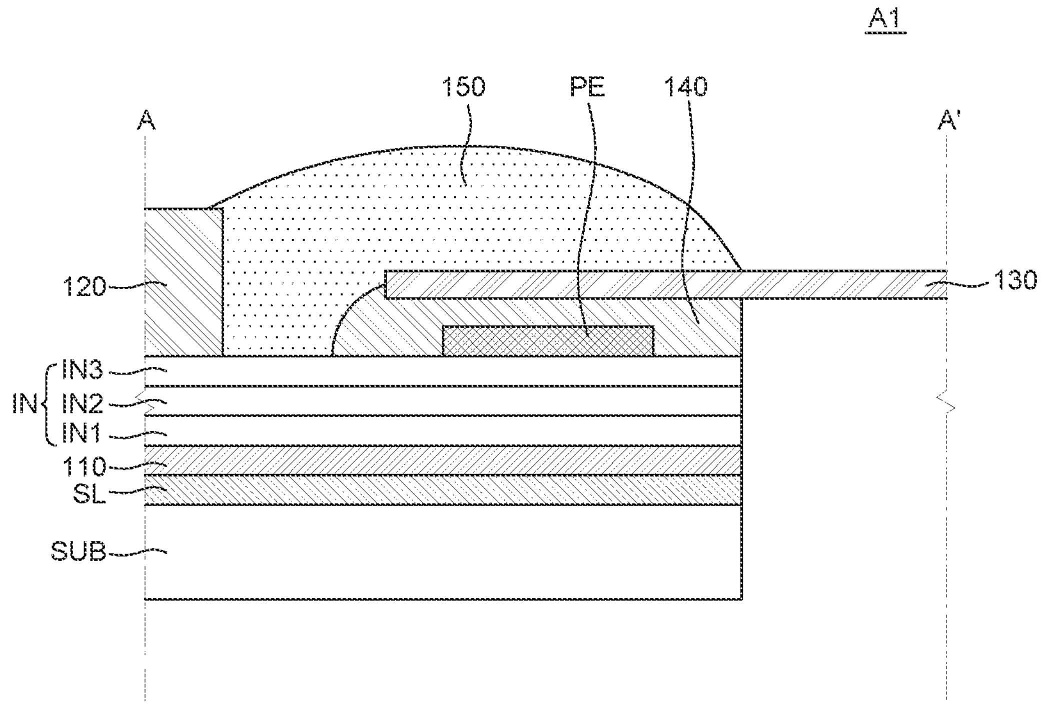
Figure 6G:
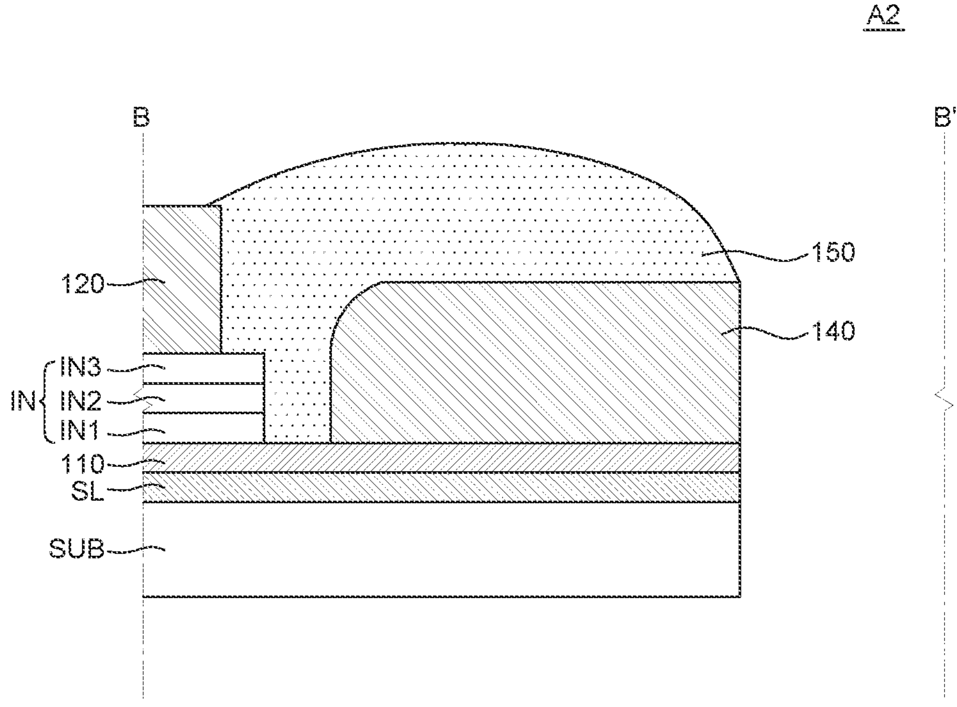
Figure 6H:
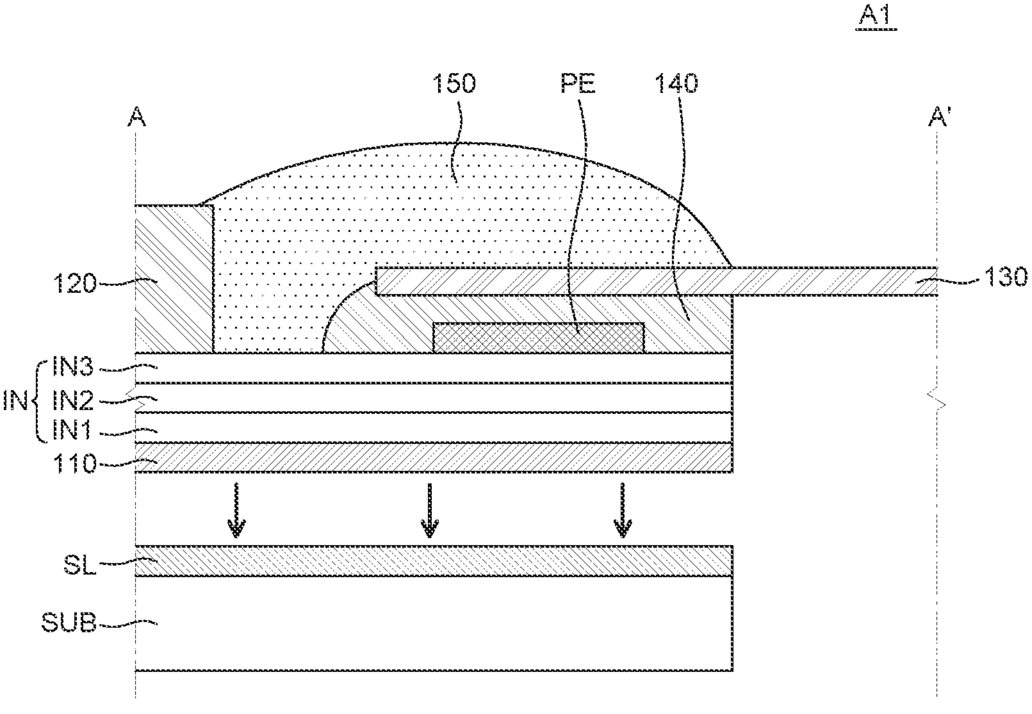
Figure 6I:
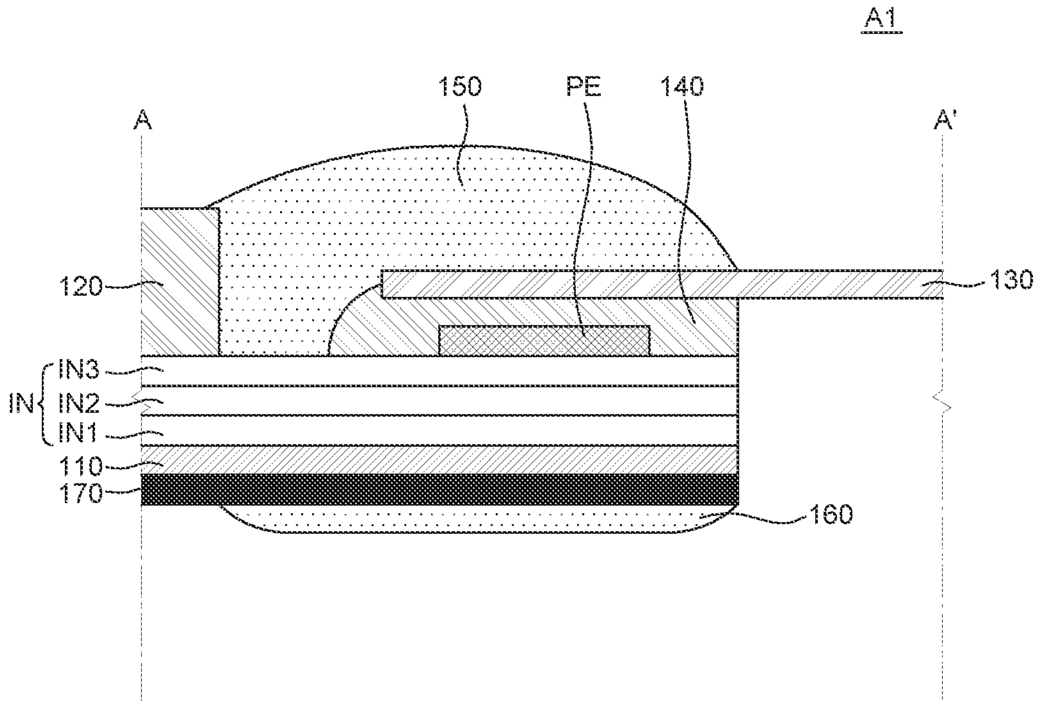
Figure 6J:
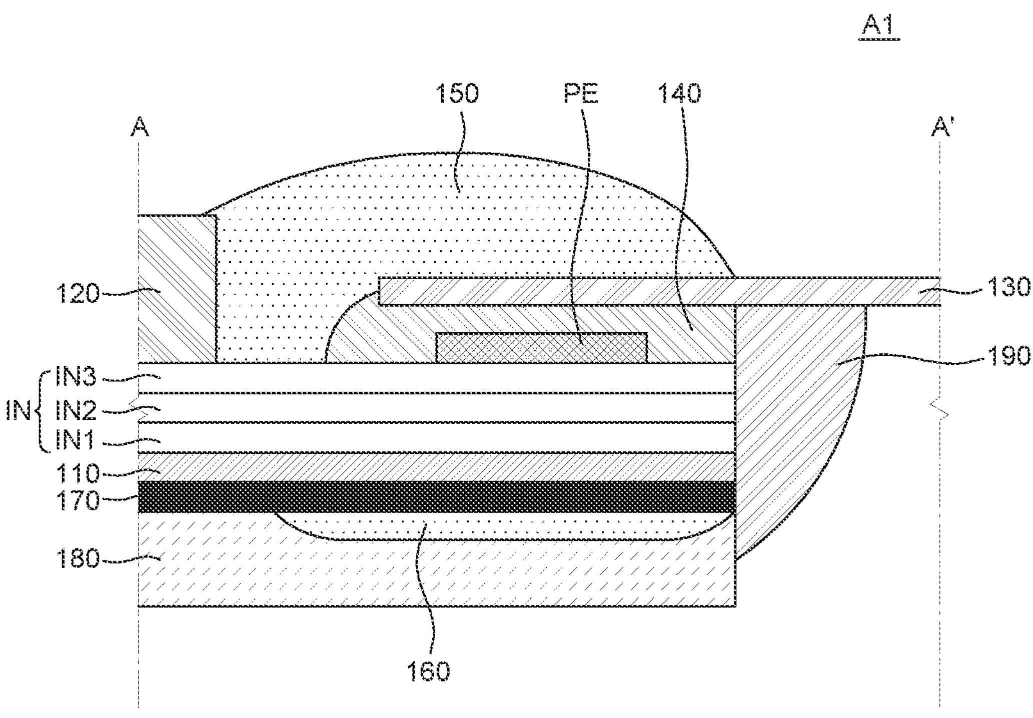

FIG. 6A through FIG. 6J are process diagrams for explaining a method for manufacturing the display device according to an exemplary embodiment of the present disclosure. More specifically, FIG. 6A through FIG. 6G are process diagrams for explaining a process for bonding the plurality of flexible films 130 and a process for forming the first sealing member 150. FIG. 6H is a process diagram for explaining the LLO process. FIG. 6I is a process diagram for explaining a process for forming the bezel pattern 170 and the second sealing member 160. FIG. 6J is a process diagram for explaining a process for forming the polarizing plate 180.

Referring to FIG. 6A through FIG. 6C, the display device 100 is manufactured in a state where a temporary substrate SUB on which a sacrificial layer SL is formed is attached under the substrate 110.

The temporary y substrate SUB serves as a substrate for supporting the substrate 110 and the components disposed on the substrate 110 while the display device 100 is manufactured. The temporary substrate SUB can be made of a material having stiffness. For example, the temporary substrate SUB can be made of glass, but is not limited thereto.

The sacrificial layer SL severs to easily separate the temporary substrate SUB from the substrate 110. The sacrificial layer SL can be dehydrogenated by irradiating a laser to the sacrificial layer SL from below the temporary substrate SUB. Then, the temporary substrate SUB and the sacrificial layer SL can be separated from the substrate 110. For example, the sacrificial layer SL can be made of hydrogenated amorphous silicon or hydrogenated and impurity-doped amorphous silicon.

Transparent conducting oxides and oxide semiconductors are materials suitable for the LLO process of the sacrificial layer SL and the temporary substrate SUB. Thus, even if the substrate 110 is made of any one of transparent conducting oxides and oxide semiconductors, the substrate 110 can be easily separated from the temporary substrate SUB. Therefore, in the display device 100 according to an exemplary embodiment of the present disclosure, the substrate 110 is formed as one of a transparent conducting oxide layer or an oxide semiconductor layer suitable for the LLO process. Accordingly, the display device 100 can be easily manufactured by using the existing process and equipment.

Then, a pixel unit can be formed in the display area AA of the substrate 110 with the temporary substrate SUB attached thereto. Further, while the pixel unit is formed, the plurality of inorganic insulating layers IN is also formed. For example, the pixel unit can include a plurality of transistors, a plurality of lines and a light emitting element. The plurality of inorganic insulating layers IN can also be formed to insulate some of the components in the pixel unit from each other or protect the components in the pixel unit.

Furthermore, while the pixel unit is formed, the plurality of pad electrodes PE is also formed in the pad area PA. The plurality of pad electrodes PE can be formed by the same process as some of the components in the pixel unit. For example, the plurality of pad electrodes PE can be formed of the same material by the same process as an electrode of the light emitting element, electrodes of the plurality of transistors and one of the plurality of lines.

The encapsulation unit 120 is formed to seal the pixel unit. The encapsulation unit 120 can be formed to enclose upper and side surfaces of the pixel unit and thus can suppress the permeation of moisture and oxygen into the pixel unit.

Then, referring to FIG. 6A, the adhesive member 140 is formed on the plurality of pad electrodes PE. The adhesive member 140 can be formed to cover at least all the plurality of pad electrodes PE in the plurality of first areas A1. In this case, FIG. 6A illustrates that the adhesive member 140 is coated to a part of the plurality of second areas A2. However, the adhesive member 140 can be coated only in the plurality of first areas A1 depending on the amount of the adhesive member 140 coated, but is not limited thereto.

Thereafter, referring to FIG. 6B through FIG. 6D, the plurality of flexible films 130 is bonded onto the plurality of pad electrodes PE. Then, the adhesive member 140 can overflow to the outside from where it is coated due to pressure applied when the plurality of flexible films 130 is bonded. For example, the adhesive member 140 coated around the plurality of first areas A1 can overflow to the plurality of second areas A2 due to pressure. Also, the adhesive member 140 can overflow toward edges of the temporary substrate SUB and the substrate 110 due to pressure.

Meanwhile, the overflowing adhesive member 140 can be filled in a space between edges of the plurality of pad electrodes PE and the plurality of inorganic insulating layers IN. For example, the overflowing adhesive member 140 can be filled in a space between the plurality of inorganic insulating layers IN and the plurality of flexible films 130. The adhesive member 140 can overflow to an area between edges of the pad electrode PE and the inorganic insulating layer IN and fill in an empty space between the plurality of flexible films 130 and the plurality of inorganic insulating layers IN. The filled adhesive member 140 can support the plurality of flexible films 130 and the plurality of first areas A1.

Specifically, even when the adhesive member 140 is formed only between the plurality of pad electrodes PE and the plurality of flexible films 130, the plurality of flexible films 130 can be electrically connected to the plurality of pad electrodes PE. However, when the adhesive member 140 is formed only in the plurality of first areas A1 and an empty space is formed between the plurality of inorganic insulating layers IN and the plurality of flexible films 130, there is no component to support the plurality of flexible films 130. Also, a stress can become non-uniform between an area in which the adhesive member 140 is not filled and an area in which the adhesive member 140. In a state where the temporary substrate SUB is attached, the temporary substrate SUB supports the area in which the adhesive member 140 is not filled and thus suppresses the occurrence of cracks. However, after the temporary substrate SUB is separated, the plurality of inorganic insulating layers IN is likely to be cracked in the area in which the adhesive member 140 is not filled.

Thus, by applying a pressure when the plurality of flexible films 130 is bonded, the adhesive member 140 can overflow to the empty space between the plurality of flexible films 130 and the plurality of inorganic insulating layers IN. For example, the adhesive member 140 can overflow to an area adjacent to the edge of the plurality of inorganic insulating layers IN. Therefore, the overflowing adhesive member 140 can be filled in the empty space between the plurality of flexible films 130 and the plurality of inorganic insulating layers IN and can support an area overlapping the plurality of flexible films 130. Accordingly, the adhesive member 140 can overflow to the empty space between the plurality of inorganic insulating layers IN and the plurality of flexible films 130 to support the plurality of flexible films 130 and suppress the occurrence of cracks in the plurality of first areas A1.

Then, referring to FIG. 6B through FIG. 6G, a part of the adhesive member 140 and the plurality of inorganic insulating layers IN can be cut off by irradiating a laser LS along a cutting line CL.

Specifically, the adhesive member 140 can overflow to fill in the empty space between the plurality of inorganic i insulating layers IN and the plurality of flexible films 130 in order to suppress the occurrence of cracks in the pad area PA. However, when the adhesive member 140 overflows to cover the side surface of the substrate 110 and a side surface of the temporary substrate SUB, the substrate 110 and the temporary substrate SUB are fixed by the adhesive member 140. Thus, it can be difficult to separate the substrate 110 from the temporary substrate SUB.

Therefore, in order for the adhesive member 140 not to overflow to the side surfaces of the substrate 110 and the temporary substrate SUB, the substrate 110 and the plurality of inorganic insulating layers IN can be temporarily extended only during a manufacturing process of the display device 100. Thus, it is possible to secure a space to which the adhesive member 140 can overflow. Then, when the plurality of flexible films 130 is completely bonded, the temporarily extended adhesive member 140 is cut off to manufacture the display device 100.

Specifically, referring to FIG. 6B and FIG. 6E together, the adhesive member 140 can be cut off by irradiating the laser LS along the cutting line CL. Further, when the adhesive member 140 is cut off, the substrate 110 and the plurality of inorganic insulating layers IN disposed between the adhesive member 140 and the temporary substrate SUB can also be cut off. In this case, the cutting line CL corresponds to an actual edge of the display device 100 when the display device 100 completely manufactured.

Referring to FIG. 6C and FIG. 6F, in the plurality of first areas A1, the temporary substrate SUB, the sacrificial layer SL, the substrate 110, the plurality of inorganic insulating layers IN and the adhesive member 140 can be cut off together by the laser LS irradiated along the cutting line CL. Side surfaces of the temporary substrate SUB, the sacrificial layer SL, the substrate 110, the plurality of inorganic insulating layers IN and the adhesive member 140, respectively, can be disposed on the same plane.

Referring to FIG. 6D and FIG. 6G, the laser LS can also be irradiated along the cutting line CL in the plurality of second areas A2. In the plurality of second areas A2, the plurality of inorganic insulating layers IN is already removed and spaced apart from the cutting line CL, and only the temporary substrate SUB, the sacrificial layer SL, the substrate 110 and the adhesive member 140 overlap the cutting line CL. Therefore, in the plurality of second areas A2, only the temporary substrate SUB, the sacrificial layer SL, the substrate 110 and the adhesive member 140 can be cut off by the laser LS irradiated along the cutting line CL.

In the display device 100 according to an exemplary embodiment of the present disclosure and the method for manufacturing the same, the laser LS is irradiated to the cutting line CL. Thus, a part of the temporary substrate SUB, the sacrificial layer SL, the substrate 110, the plurality of inorganic insulating layers IN and the adhesive member 140, which is temporarily extended to secure a space to which the adhesive member 140 overflows, outside the cutting line CL can be cut off and removed.

Also, to block the propagation of cracks, which occurs in the area in which the adhesive member 140 is not filled, into the display device 100, the inorganic insulating layer IN can be cut off at an outer periphery in which the adhesive member 140 is highly likely not to be filled. Specifically, when the plurality of flexible films 130 is bonded, the adhesive member 140 may not completely overflow to the edge of the plurality of inorganic insulating layers IN. Thus, there can be an area in which the adhesive member 140 is not filled. For example, as shown in FIG. 6C, in a partial area outside the cutting line CL, there can be an area in which the adhesive member 140 is not filled. In the non-filled area, the plurality of inorganic insulating layers IN can be highly likely to be cracked.

Therefore, in the display device 100 according to an exemplary embodiment of the present disclosure and the method for manufacturing the same, the outer periphery of the substrate 110 and the plurality of inorganic insulating layers IN, which is temporarily extended to secure a space to which the adhesive member 140 overflows, is cut off. Thus, it is possible to remove the area in which the adhesive member 140 is not filled and also block the propagation of cracks occurring in the non-filled area into the display device 100. Therefore, the completely manufactured display device 100 can include only the area in which the adhesive member 140 is filled between the plurality of flexible films 130 and the plurality of inorganic insulating layers IN.

Further, even when the substrate 110 and the plurality of inorganic insulating layers IN are extended in length to secure a space to which the adhesive member 140 overflows, the adhesive member 140 can also overflow to the side surfaces of the substrate 110 and the temporary substrate SUB. In this case, in a cutting process of cutting off the substrate 110, the plurality of inorganic insulating layers IN and the adhesive member 140, the sacrificial layer SL and the temporary substrate SUB can also be cut off. Alternatively, the adhesive member 140 overflowing to the side surfaces of the temporary substrate SUB and the substrate 110 can be cut off. Thus, it is possible to easily separate the substrate 110 from the temporary substrate SUB.

Meanwhile, for the convenience of description, FIG. 6F and FIG. 6G illustrate that all the temporary substrate SUB, the sacrificial layer SL, the substrate 110 and the plurality of inorganic insulating layers IN are cut off by the laser LS irradiated along the cutting line CL corresponding to the actual edge of the substrate 110. However, only the substrate 110, the plurality of inorganic insulating layers IN and the adhesive member 140 can be selectively cut off by regulating the laser LS. However, the present disclosure is not limited thereto.

Then, referring to FIG. 6F and FIG. 6G, after the cutting process, the first sealing member 150 is formed in the non-display area NA including the pad area PA. The first sealing member 150 can be formed to cover a side surface of the encapsulation unit 120 and the plurality of flexible films 130 in the non-display area NA.

Thereafter, referring to FIG. 6H, the substrate 110 and the temporary substrate SUB can be separated through the LLO process. The sacrificial layer SL can be made of hydrogenated amorphous silicon or hydrogenated and impurity-doped amorphous silicon. When a laser is irradiated toward the temporary substrate SUB and the sacrificial layer SL from below the temporary substrate SUB, the sacrificial layer SL can be dehydrogenated. Thus, the sacrificial layer SL and the temporary substrate SUB can be separated from the substrate 110.

Then, referring to FIG. 6I, the bezel pattern 170 is formed under the substrate 110 which is separated from the temporary substrate SUB and the sacrificial layer SL and exposed. The bezel pattern 170 can be formed under the substrate 110 so as to correspond to the non-display area NA.

Then, after the bezel pattern 170 is formed, the second sealing member 160 is formed under the bezel pattern 170. The second sealing member 160 can be formed at least in the pad area PA of the non-display area NA so as to cover the bezel pattern 170. The second sealing member 160 can be formed in the pad area PA to fix the plurality of first areas A1 where the plurality of flexible films 130 is bonded and support the plurality of first areas A1 and the plurality of second areas A2.

Referring to FIG. 6J, the polarizing plate 180 is attached under the bezel pattern 170 and the second sealing member 160. As described above with reference to FIG. 4 and FIG. 5, the polarizing plate 180 including a portion patterned corresponding to the plurality of second areas A2 can be attached. Even when the polarizing plate 180 is attached, the portion of the polarizing plate 180 corresponding to the plurality of second areas A2 is removed. Therefore, the second sealing member 160 overlapping the plurality of second areas A2 can be exposed from the polarizing plate 180. Further, the second sealing member 160 overlapping the plurality of first areas A1 can be covered by the polarizing plate 180.

Finally, in the plurality of first areas A1, the resin layer 190 is formed to cover a side surface of the display device 100. The resin layer 190 can be in contact with the side surface of the substrate 110, the side surface of the plurality of inorganic insulating layers IN, a side surface of the adhesive member 140, a side surface of the bezel pattern 170 and a side surface of the polarizing plate 180 as well as one surface of the plurality of flexible films 130. The resin layer 190 can be formed to support the plurality of flexible films 130 disposed outside the substrate 110.

In the display device 100 according to an exemplary embodiment of the present disclosure and the method for manufacturing the same, the substrate 110 is made of any one of transparent conducting oxides and oxide semiconductors. Thus, the thickness of the display device 100 can be reduced.

Conventionally, a plastic substrate has been used for a substrate of a display device. However, the plastic substrate is often formed by coating and curing a substrate material at a high temperature. Thus, it can take a long time to form the plastic substrate and it is difficult to form the plastic substrate to a predetermined thickness or less. However, transparent conducting oxides and oxide semiconductors can be formed to a very small thickness through a deposition process such as sputtering.

Therefore, in the display device 100 according to an exemplary embodiment of the present disclosure, the substrate 110 configured to support various components of the display device 100 is formed as one of a transparent conducting oxide layer or an oxide semiconductor layer. Thus, the thickness of the display device 100 can be reduced and the display device 100 can have a slim design.

Meanwhile, conventionally, a flexible display device has been formed by forming a light emitting element and a driving circuit on a plastic substrate which is relatively flexible compared to a glass substrate. However, when the display device is excessively deformed, the display device can be damaged due to a stress caused by the deformation. Accordingly, it is preferable to reduce the thickness of the display device to further improve flexibility and thus reduce a stress applied to the display device. However, as described above, it can be difficult to form the plastic substrate to a predetermined thickness or less.

In contrast, in the display device 100 according to an exemplary embodiment of the present disclosure and the method for manufacturing the same, the substrate 110 is made of a transparent conducting oxide or an oxide semiconductor to improve flexibility of the display device 100. Also, it is possible to reduce a stress generated when the display device 100 is deformed. Specifically, if the substrate 110 is formed as one of a transparent conducting oxide layer or an oxide semiconductor layer, the substrate 110 can be formed as a very thin film. In this case, the substrate 110 can also be referred to as a transparent thin film layer. Accordingly, the display device 100 including the substrate 110 can have high flexibility, and the display device 100 can be easily bent or rolled.

Therefore, in the display device 100 according to an exemplary embodiment of the present disclosure, the substrate 110 is formed as any one of a transparent conducting oxide layer or an oxide semiconductor layer. As such, flexibility of the display device 100 can be improved and a stress generated when the display device 100 is deformed can be reduced. Therefore, it is possible to minimize the occurrence of cracks or the like in the display device 100.

Although the flexible display device has been implemented using a plastic substrate instead of a glass substrate, the plastic substrate is more likely to generate static electricity than the glass substrate. Such static electricity can influence various lines and driving elements on the plastic substrate, and, thus, some of the components can be damaged or a display quality of the display device can be degraded. Therefore, the display device using the plastic substrate further needs a separate component for blocking and discharging static electricity.

In the display device 100 according to an exemplary embodiment of the present disclosure and the method for manufacturing the same, the substrate 110 is formed as any one of a transparent conducting oxide layer and an oxide semiconductor layer. Thus, it is possible to reduce the possibility of generation of static electricity in the substrate 110.

Further, if the substrate is made of plastic and static electricity is generated, static electricity can damage various lines and driving elements on the substrate or influence driving of the components. Therefore, a display quality can be degraded.

However, according to the embodiments of the present disclosure, formed as a transparent conducting oxide layer or an oxide semiconductor layer, it is possible to minimize the generation of static electricity in the substrate 110. Also, it is possible to simplify a component for blocking and discharging static electricity. Therefore, in the display device 100 according to an exemplary embodiment of the present disclosure, the substrate 110 is formed as any one of a transparent conducting oxide layer or an oxide semiconductor layer which is less likely to generate static electricity. Thus, it is possible to minimize damage or degradation in image quality caused by static electricity.

Further, if a plastic substrate is used for a substrate of a display device, foreign materials can be generated while the plastic substrate is formed. For example, when a substrate material is coated and cured to form a plastic substrate, foreign materials can be generated. Further, these foreign materials can facilitate the permeation of moisture and oxygen into the display device.

Furthermore, various components on the substrate can be non-uniformly formed due to the foreign materials. Therefore, in the plastic substrate formed by coating and curing, the foreign materials can cause deterioration of a light emitting element or degradation in characteristics of a transistor inside the display device.

In contrast, in the display device 100 according to an exemplary embodiment of the present disclosure and the method for manufacturing the same, the substrate 110 is made of a transparent conducting oxide or an oxide semiconductor. Thus, it is possible to minimize the permeation of moisture or oxygen from the outside into the display device 100 through the substrate 110. If the substrate 110 is formed as a transparent conducting oxide layer or an oxide semiconductor layer, the substrate 110 is formed in a vacuum environment. Therefore, the possibility of generation of foreign materials is remarkably low. Further, even if foreign materials are generated, the foreign materials are very small in size. Therefore, it is possible to minimize the permeation of moisture and oxygen into the display device 100.

Accordingly, in the display device 100 according to an exemplary embodiment of the present disclosure, the substrate 110 is made of a transparent conducting oxide or an oxide semiconductor which is less likely to generate foreign materials and has an excellent moisture blocking performance. Thus, it is possible to improve reliability of the light emitting element including an organic layer and the display device 100.

Further, in the display device 100 according to an exemplary embodiment of the present disclosure and the method for manufacturing the same, the substrate 110 is made of any one of a transparent oxide or an oxide semiconductor. Thus, a barrier film, which is thin and cheap, can be attached under the substrate 110.

If a substrate is made of a material, such as plastic, having a low moisture blocking performance, a barrier film, which is thick and expensive, can be attached to supplement the moisture blocking performance.

However, in the display device 100 according to an exemplary embodiment of the present disclosure, the substrate 110 is made of a transparent conducting oxide or an oxide semiconductor having an excellent moisture blocking performance. Thus, a barrier film, which is thin and cheap, can be attached under the substrate 110. Therefore, in the display device 100 according to an exemplary embodiment of the present disclosure, the substrate 110 is made of any one of a transparent conducting oxide or an oxide semiconductor having an excellent moisture blocking performance. Accordingly, it is possible to reduce manufacturing costs of the display device 100.

In the display device 100 according to an exemplary embodiment of the present disclosure and the method for manufacturing the same, the substrate 110 is made of any one of a transparent conducting oxide or an oxide semiconductor. Thus, it is possible to perform a laser lift off (LLO) process. When the display device 100 is manufactured, the temporary substrate SUB on which the sacrificial layer SL is formed can be attached under the substrate 110 and then, a pixel unit can be formed on the substrate 110. For example, the sacrificial layer SL can be made of hydrogenated amorphous silicon or hydrogenated and impurity-doped amorphous silicon. If a laser is irradiated from below the temporary substrate SUB after the display device 100 is completely manufactured, the sacrificial layer SL can be dehydrogenated. Thus, the sacrificial layer SL and the temporary substrate SUB can be separated from the substrate 110. In this case, the transparent conducting oxide and the oxide semiconductor are materials suitable for the LLO process of the sacrificial layer SL and the temporary substrate SUB.

Thus, even if the substrate 110 is made of any one of the transparent conducting oxide or the oxide semiconductor, the substrate 110 can be easily separated from the temporary substrate SUB. Therefore, in the display device 100 according to an exemplary embodiment of the present disclosure, the substrate 110 is formed as one of a transparent conducting oxide layer or an oxide semiconductor layer suitable for the LLO process. Accordingly, the display device 100 can be easily manufactured by using the existing process and equipment.

In the display device 100 according to an exemplary embodiment of the present disclosure and the method for manufacturing the same, when the plurality of flexible films 130 is bonded, the adhesive member 140 can overflow to an area between the pad electrode PE and the edge of the plurality of inorganic insulating layers IN. Thus, it is possible to support the plurality of first areas A1 under the plurality of flexible films 130 and suppress the occurrence of cracks in the plurality of first areas A1. Even when the adhesive member 140 is formed only between the plurality of pad electrodes PE and the plurality of flexible films 130, the plurality of pad electrodes PE can be electrically connected to the plurality of flexible films 130.

However, when the adhesive member is not filled in an area between the edges of the plurality of pad electrodes PE and the plurality of inorganic insulating layers IN, i.e., between the plurality of flexible films and the plurality of inorganic insulating layers IN, there is no component for supporting the non-filled area after separation of the temporary substrate SUB. Therefore, the plurality of inorganic insulating layers IN may be cracked or torn.

Accordingly, in the display device 100 according to an exemplary embodiment of the present disclosure and the method for manufacturing the same, when the plurality of flexible films 130 is bonded, the adhesive member 140 can overflow and fill in an empty space under the plurality of flexible films 130. The filled adhesive member 140 can support the plurality of flexible films 130 and the plurality of first areas A1 even after separation of the temporary substrate SUB. In particular, it is possible to suppress the occurrence of cracks in the plurality of inorganic insulating layers IN.

In the display device 100 according to an exemplary embodiment of the present disclosure and the method for manufacturing the same, the adhesive member 140 overflowing to the outside of the actual edge of the substrate 110 is cut off. Thus, the temporary substrate SUB can be easily separated from the substrate 110. Specifically, if the adhesive member 140 overflows to all of the plurality of first areas A1, the adhesive member 140 can also overflow to the side surface of the substrate 110 and the side surface of the temporary substrate SUB. In this case, the adhesive member 140 makes it difficult to separate the substrate 110 from the temporary substrate SUB. Accordingly, in the display device 100 according to an exemplary embodiment of the present disclosure and the method for manufacturing the same, the substrate 110 and the plurality of inorganic insulating layers IN on the substrate 110 are extended longer than the actual edge of the substrate 110. Thus, a space to which the adhesive member 140 overflows can be secured. Also, the adhesive member 140 can sufficiently overflow to the actual edge of the substrate 110.

Further, the substrate 110, the plurality of inorganic insulating layers IN and the adhesive member 140 can be cut off by irradiating the laser LS along the actual edge of the substrate 110. Even if the adhesive member 140 overflows beyond the space to the side surfaces of the substrate 110 and the temporary substrate SUB, the adhesive member 140 can be cut off and separated by using the laser LS. Therefore, the substrate 110 can be easily separated from the temporary substrate SUB. Accordingly, in the display device 100 according to an exemplary embodiment of the present disclosure and the method for manufacturing the same, the adhesive member 140 overflows to the outside of the actual edge of the substrate 110. Thus, the adhesive member 140 can be easily filled in a space between the plurality of flexible films 130 and the plurality of first areas A1. Also, the adhesive member 140 overflowing to the outside of the actual edge of the substrate 110 is cut off. Thus, the substrate 110 can be easily separated from the temporary substrate SUB.

In the display device 100 according to an exemplary embodiment of the present disclosure and the method for manufacturing the same, the plurality of inorganic insulating layers IN is patterned in the plurality of second areas A2 to suppress the occurrence of cracks. In the plurality of second areas A2 of the pad area PA, the plurality of pad electrodes PE, the adhesive member 140 and the flexible film 130 disposed in the plurality of first areas A1 are not disposed. In this case, the temporary substrate SUB temporarily attached when the display device 100 is manufactured can support the plurality of second areas A2.

However, after the temporary substrate is removed, there is no layer for supporting the plurality of second areas. The plurality of second areas is vulnerable to a stress and the plurality of inorganic insulating layers is highly likely to be cracked. The substrate is made of one of a transparent conducting oxide layer or an oxide semiconductor and is suitable for the LLO process. Thus, it can be difficult for the substrate to support the plurality of inorganic insulating layers IN. Thus, the plurality of inorganic insulating layers IN which has a high hardness and is made of a material having a low malleability and thus can be relatively easily cracked by a stress can be removed in advance from the plurality of second areas A2. Therefore, it is possible to suppress the occurrence of cracks in the plurality of second areas A2.

In the plurality of second areas A2, the edge of the plurality of inorganic insulating layers IN is disposed inside the edge of the substrate 110. Therefore, it is possible to minimize the occurrence of cracks in the plurality of inorganic insulating layers IN caused by impacts from the outside. Accordingly, in the display device 100 according to an exemplary embodiment of the present disclosure, the plurality of inorganic insulating layers IN vulnerable to cracks is patterned in the plurality of second areas A2 to reduce an error of the display device 100.

In the display device 100 according to an exemplary embodiment of the present disclosure and the method for manufacturing the same, the second sealing member 160 is formed under the substrate 110 in the pad area PA. Thus, the plurality of first areas A1 and the plurality of second areas A2 can be fixed and supported to each other. In the plurality of second areas A2 unlike the plurality of first areas A1 of the pad area PA, the plurality of inorganic insulating layers IN is patterned and the plurality of pad electrodes PE and the plurality of flexible films 130 are not disposed. For example, the plurality of first areas A1 has a different laminated structure from the plurality of second areas A2 and the plurality of first areas A1 can have different stiffness from the plurality of second areas A2. Also, the plurality of second areas A2 can be relatively easily deformed. Further, the substrate 110 disposed in both the plurality of first areas A1 and the plurality of second areas A2 is a flexible thin film layer. Thus, it can be difficult for the substrate 110 to support the plurality of first areas A1 and the plurality of second areas A2. In this case, the pad area PA can be warped or cracked. Thus, the second sealing member 160 is formed under the plurality of first areas A1 and the plurality of second areas A2 to fix and support the plurality of first areas A1 and the plurality of second areas A2. Therefore, in the display device 100 according to an exemplary embodiment of the present disclosure, the second sealing member 160 is formed to support and fix the pad area PA. Accordingly, it is possible to minimize the occurrence of warpages or cracks in the pad area PA.

In the display device 100 according to an exemplary embodiment of the present disclosure and the method for manufacturing the same, the polarizing plate 180 is patterned in the plurality of second areas A2. Thus, it is possible to minimize the occurrence of warpages in the polarizing plate 180. As described above, the plurality of first areas A1 has a different laminated structure and different components from the plurality of second areas A2 and thus can have different stiffness from the plurality of second areas A2. In the plurality of first areas A1, the plurality of pad electrodes PE or the plurality of flexible films 130 is disposed. Thus, the polarizing plate 180 is supported. However, in the plurality of second areas A2, the plurality of inorganic insulating layers IN is patterned and only the substrate 110 or the first sealing member 150 is disposed. Thus, it can be difficult to support the polarizing plate 180. Also, the polarizing plate 180 can be easily deformed by moisture or the like. Therefore, in the plurality of second areas I the polarizing plate 180 is patterned to suppress the occurrence of warpages in the polarizing plate 180. Accordingly, in the display device 100 according to an exemplary embodiment of the present disclosure, the polarizing plate 180 which may be vulnerable to warpages is patterned in the plurality of second areas A2. Thus, it is possible to reduce an error of the display device 100.

Figure 7:
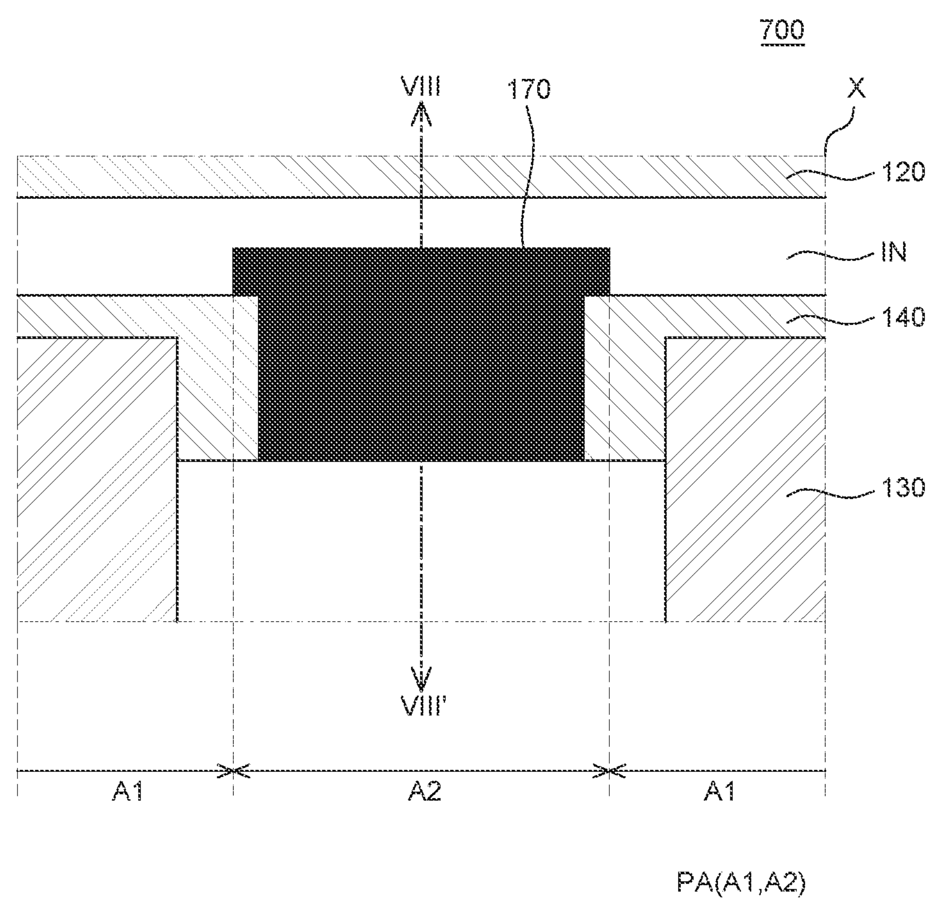
FIG. 7 is an enlarged plan view of a display device according to another exemplary embodiment of the present disclosure.
Figure 8:
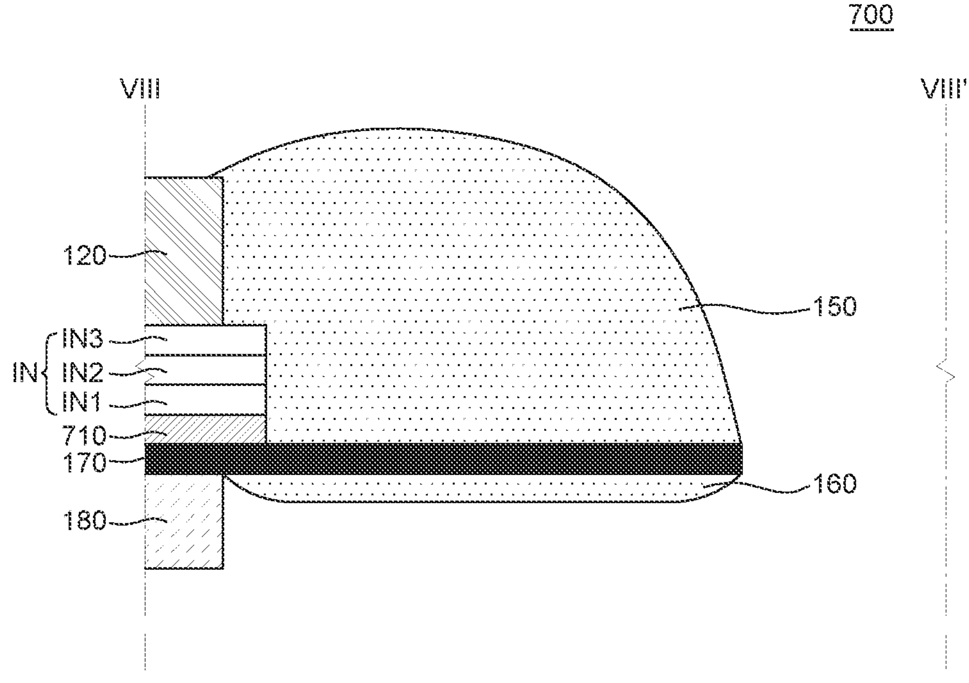
FIG. 8 is a cross-sectional view as taken along a line VIII-VIII' of FIG. 7.

FIG. 7 is an enlarged plan view of a display device according to another exemplary embodiment of the present disclosure. FIG. 8 is a cross-sectional view as taken along a line VIII-VIII' of FIG. 7. A display device 700 shown in FIG. 7 and FIG. 8 is substantially the same as the display device 100 shown in FIG. 1 through FIG. 5 except a substrate 710. Therefore, a redundant description thereof will be omitted or is briefly provided.

Referring to FIG. 7 and FIG. 8, a part of the substrate 710 corresponding to the plurality of second areas A2 is patterned. The substrate 710 can overlap the non-display area NA except the plurality of second areas A2. For example, a part of the substrate 710 overlapping the plurality of second areas A2 can be removed, and, thus, the substrate 710 may not be disposed in the plurality of second areas A2. In this case, a part of the plurality of inorganic insulating layers IN and the polarizing plate 180 corresponding to the plurality of second areas A2 can also be patterned. Therefore, the substrate 710 can correspond in shape to the polarizing plate 180 and the plurality of inorganic insulating layers IN when viewed from above.

Referring to FIG. 8, in the plurality of second areas A2 from which the substrate 710 is removed, the first sealing member 150 can be directly bonded to one surface of the bezel pattern 170. In the plurality of second areas A2, the first sealing member 150 can cover an edge of the encapsulation unit 120, an edge of the plurality of inorganic insulating layers IN, an edge of the substrate 710 and the one surface of the bezel pattern 170.

Meanwhile, when the display device 700 is manufactured, the adhesive member 140 and the first sealing member 150 can be formed in the pad area PA in a state where a part of the substrate 710 corresponding to the plurality of second areas A2 is patterned. In this case, in the plurality of second areas A2, the adhesive member 140 and the first sealing member 150 can be in contact with the sacrificial layer SL exposed by patterning the substrate 710. Herein, an organic material forming the adhesive member 140 and the first sealing member 150 is suitable for the LLO process like the substrate 710 made of one of a transparent conducting oxide and an oxide semiconductor. Therefore, even if the substrate 710 is patterned, the sacrificial layer SL is exposed and the adhesive member 140 and the first sealing member 150 are in contact with the sacrificial layer SL in the plurality of second areas A2, the sacrificial layer SL and the temporary substrate SUB can be easily separated from the adhesive member 140 and the first sealing member 150.

In the display device 700 according to another exemplary embodiment of the present disclosure, the substrate 710 corresponding to the plurality of second areas A2 of the pad area PA is removed. Thus, it is possible to suppress a stress caused by the substrate 710 in the plurality of second areas A2. Unlike the plurality of first areas A1, the plurality of second areas A2 in which the plurality of pad electrodes PE, the adhesive member 140 and the plurality of flexible films 130 are not disposed and which has a relatively low stiffness can be vulnerable to a stress. For example, there is no stiff component for supporting the plurality of second areas A2, and, thus, the components disposed on the plurality of second areas A2 can be cracked easily or can be defective. Thus, in the plurality of second areas A2, the substrate 710 is patterned together with the plurality of inorganic insulating layers IN to reduce a stress caused by the substrate 710. Also, it is possible to suppress the occurrence of cracks in the plurality of inorganic insulating layers IN. Therefore, in the display device 700 according to another embodiment exemplary of the present disclosure, the substrate 710 is patterned in the plurality of second areas A2. Thus, it is possible to remove a stress caused by the substrate 710 and improve reliability of the display device 700.

The exemplary embodiments of the present disclosure can also be described as follows:

According to an aspect of the present disclosure, there is provided a display device. The display device includes a substrate including a display area and a non-display area including a pad area extending from the display area and made of any one of a transparent conducting oxide and an oxide semiconductor, a plurality of inorganic insulating layers disposed on the substrate, and a plurality of flexible films whose one ends are bonded to the pad area. In the plurality of inorganic insulating layers overlaps the plurality of flexible films, and does not overlap an area between the plurality of flexible films.

The display device can further include an adhesive member disposed between the pad area and the plurality of flexible films. A side surface of the adhesive member can be disposed on the same plane as a side surface of the plurality of inorganic insulating layers in an area where the plurality of inorganic insulating layers overlaps the plurality of flexible films.

The adhesive member can be disposed in the area between the plurality of flexible films and can be in contact with a side surface of at least some of the plurality of inorganic insulating layers.

The display device can further include a first sealing member disposed in the pad area to cover the plurality of flexible films, and a second sealing member disposed under the substrate in the pad area. The first sealing member can correspond in shape to the non-display area when viewed from above, and the second sealing member can correspond in shape to the pad area when viewed from above.

The first sealing member can cover an upper surface of the substrate and an edge of the plurality of inorganic insulating layers in the area between the plurality of flexible films.

The display device can further include a polarizing plate disposed under the substrate and the second sealing member. The polarizing plate can cover the second sealing member in an area where the polarizing plate overlaps the plurality of flexible films, and the second sealing member can be exposed from the polarizing plate in the area between the plurality of flexible films.

The display device can further include a bezel pattern disposed between the substrate and the second sealing member.

The substrate may not overlap the area between the plurality of flexible films, the first sealing member can cover an edge of the substrate and an edge of the plurality of inorganic insulating layers in the area between the plurality of flexible films, and at least a part of the bezel pattern can be in contact with the first sealing member in the area between the plurality of flexible films.

The display device can further include a resin layer in contact with a part of the plurality of flexible films disposed outside the substrate, a side surface of the plurality of inorganic insulating layers, and a side surface of the substrate.

According to an aspect of the present disclosure, there is provided a display device. The display device includes a substrate including a plurality of first areas where a plurality of pad electrodes is disposed and a plurality of second areas between the plurality of first areas, a plurality of flexible films electrically connected to the plurality of pad electrodes, a first sealing member disposed on the substrate to cover the plurality of flexible films, and a plurality of inorganic insulating layers disposed between the substrate and the plurality of pad electrodes in the plurality of first areas. The first sealing member can cover an upper portion of the plurality of inorganic insulating layers in the plurality of first areas, and cover upper and side surfaces of the plurality of inorganic insulating layers in the plurality of second areas.

The display device can further include a second sealing member disposed under the substrate. The second sealing member can overlap the plurality of first areas and the plurality of second areas.

The display device can further include a polarizing plate disposed under the substrate and the second sealing member. The polarizing plate can overlap the second sealing member in the plurality of first areas among the plurality of first areas and the plurality of second areas.

The display device can further include a bezel pattern disposed between the polarizing plate and the substrate and between the second sealing member and the substrate.

The display device can further include an adhesive member disposed between the plurality of pad electrodes and the plurality of flexible films in the plurality of first areas. An edge of the adhesive member can correspond to an edge of the plurality of inorganic insulating layers in the plurality of first areas.

At least a part of the adhesive member can protrude from the plurality of first areas to the plurality of second areas, and the adhesive member can be disposed between the first sealing member and the substrate in the plurality of second areas.

The display device can further include a resin layer in contact with a lower surface of the plurality of flexible films, a side surface of the adhesive member, and a side surface of the plurality of inorganic insulating layers in the plurality of first areas.

The substrate can be made of any one of a transparent conducting oxide and an oxide semiconductor.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate including a display area and a non-display area including a pad area extending from the display area, the substrate being made of any one of a transparent conducting oxide and an oxide semiconductor;

a plurality of inorganic insulating layers disposed on the substrate, the plurality of inorganic insulating layers extending across the display area of the substrate and the non-display area of the substrate; and a plurality of flexible films whose one ends are bonded to the pad area, wherein the plurality of inorganic insulating layers overlaps the plurality of flexible films, and does not overlap an area between the plurality of flexible films, and wherein the plurality of inorganic insulating layers includes a notched area or cut out portion located between two adjacent flexible films among the plurality of flexible films in a plan view.

2. The display device according to claim 1, further comprising:

an adhesive member disposed between the pad area and the plurality of flexible films, wherein a side surface of the adhesive member is disposed on a same plane as a side surface of the plurality of inorganic insulating layers in an area where the plurality of inorganic insulating layers overlaps the plurality of flexible films.

3. The display device according to claim 2, wherein the adhesive member is disposed in the area between the plurality of flexible films, and is in contact with a side surface of at least some of the plurality of inorganic insulating layers.

4. The display device according to claim 1, further comprising:

a first sealing member disposed in the pad area to cover the plurality of flexible films; and a second sealing member disposed under the substrate in the pad area, wherein the first sealing member corresponds in shape to the non-display area when viewed from above, and the second sealing member corresponds in shape to the pad area when viewed from above.

5. The display device according to claim 4, wherein the first sealing member covers an upper surface of the substrate and an edge of the plurality of inorganic insulating layers in the area between the plurality of flexible films.

6. The display device according to claim 4, further comprising:

a polarizing plate disposed under the substrate and the second sealing member, wherein the polarizing plate covers the second sealing member in an area where the polarizing plate overlaps the plurality of flexible films, and the second sealing member is exposed from the polarizing plate in the area between the plurality of flexible films.

7. The display device according to claim 4, further comprising:

a bezel pattern disposed between the substrate and the second sealing member.

8. The display device according to claim 7, wherein the substrate does not overlap the area between the plurality of flexible films, the first sealing member covers an edge of the substrate and an edge of the plurality of inorganic insulating layers in the area between the plurality of flexible films, and at least a part of the bezel pattern is in contact with the first sealing member in the area between the plurality of flexible films.

9. The display device according to claim 1, further comprising:

a resin layer in contact with a part of the plurality of flexible films disposed outside the substrate, a side surface of the plurality of inorganic insulating layers, and a side surface of the substrate.

10. A display device, comprising:

a substrate including a plurality of first areas where a plurality of pad electrodes is disposed, and a plurality of second areas between the plurality of first areas;

a plurality of flexible films electrically connected to the plurality of pad electrodes;

a first sealing member disposed on the substrate to cover the plurality of flexible films; and a plurality of inorganic insulating layers disposed between the substrate and the plurality of pad electrodes in the plurality of first areas, wherein the first sealing member covers an upper portion of the plurality of inorganic insulating layers in the plurality of first areas, and covers upper and side surfaces of the plurality of inorganic insulating layers in the plurality of second areas, and wherein the plurality of inorganic insulating layers includes a notched area or cut out portion located between two adjacent flexible films among the plurality of flexible films in a plan view.

11. The display device according to claim 10, further comprising:

a second sealing member disposed under the substrate, wherein the second sealing member overlaps the plurality of first areas and the plurality of second areas.

12. The display device according to claim 11, further comprising:

a polarizing plate disposed under the substrate and the second sealing member, wherein the polarizing plate overlaps the second sealing member in the plurality of first areas among the plurality of first areas and the plurality of second areas.

13. The display device according to claim 12, further comprising:

a bezel pattern disposed between the polarizing plate and the substrate and between the second sealing member and the substrate.

14. The display device according to claim 10, further comprising:

an adhesive member disposed between the plurality of pad electrodes and the plurality of flexible films in the plurality of first areas, wherein an edge of the adhesive member corresponds to an edge of the plurality of inorganic insulating layers in the plurality of first areas.

15. The display device according to claim 14, wherein at least a part of the adhesive member protrudes from the plurality of first areas to the plurality of second areas, and the adhesive member is disposed between the first sealing member and the substrate in the plurality of second areas.

16. The display device according to claim 14, further comprising:

a resin layer in contact with a lower surface of the plurality of flexible films, a side surface of the adhesive member, and a side surface of the plurality of inorganic insulating layers in the plurality of first areas.

17. The display device according to claim 10, wherein the substrate is made of any one of a transparent conducting oxide and an oxide semiconductor.

18. The display device according to claim 1, further comprising a polarizing plate, wherein the polarizing plate and the plurality of inorganic insulating layers are disposed on opposite sides of the substrate.

19. The display device according to claim 1, wherein the plurality of inorganic insulating layers includes at least three inorganic insulating layers.

* * * * *